US007586060B2

(12) United States Patent  
Urairi et al.

(10) Patent No.: US 7,586,060 B2
(45) Date of Patent: Sep. 8, 2009

(54) PROTECTIVE SHEET FOR LASER PROCESSING AND MANUFACTURING METHOD OF LASER PROCESSED PARTS

(75) Inventors: Masakatsu Urairi, Ibaraki (JP); Atsushi Hino, Ibaraki (JP); Naoyuki Matsuo, Ibaraki (JP); Tomokazu Takahashi, Ibaraki (JP); Takeshi Matsumura, Ibaraki (JP); Syouji Yamamoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 28 days.

(21) Appl. No.: 10/584,825

(22) PCT Filed: Nov. 2, 2004

(86) PCT No.: PCT/JP2004/016268

§ 371 (c)(1),
(2), (4) Date: Jun. 26, 2006

(87) PCT Pub. No.: WO2005/063435

PCT Pub. Date: Jul. 14, 2005

(65) Prior Publication Data

US 2007/0181543 A1   Aug. 9, 2007

(30) Foreign Application Priority Data

Dec. 25, 2003 (JP) .............................. 2003-430451
Dec. 25, 2003 (JP) .............................. 2003-430463
Mar. 30, 2004 (JP) .............................. 2004-099896
Mar. 30, 2004 (JP) .............................. 2004-100112
Mar. 30, 2004 (JP) .............................. 2004-100127
Mar. 30, 2004 (JP) .............................. 2004-100141
Mar. 30, 2004 (JP) .............................. 2004-100199
Mar. 30, 2004 (JP) .............................. 2004-100281

(51) Int. Cl.
*B23K 26/38* (2006.01)
(52) U.S. Cl. .............................. 219/121.71; 219/121.72
(58) Field of Classification Search .............. 219/121.7, 219/121.71, 121.72; 525/327.4; 156/272.8
See application file for complete search history.

(56) References Cited

U.S. PATENT DOCUMENTS 5,169,678 A * 12/1992 Cole et al. .................. 427/555

(Continued)

FOREIGN PATENT DOCUMENTS

EP          0 863 231 A       9/1998

(Continued)

OTHER PUBLICATIONS

Chinese Office Action issued on the corresponding Chinese Patent Application No. 200480038742.8, dated May 5, 2008.

(Continued)

*Primary Examiner*—Geoffrey S Evans
(74) *Attorney, Agent, or Firm*—Knobbe Martens Olson & Bear LLP

(57) ABSTRACT

A laser processing protection sheet (2) capable of effectively preventing contamination on the surface of an article to be processed by decomposition products when the article to be processed (1) is processed by the UV absorption ablation of a laser beam (7). A production method for a laser processed article (10) using the laser processing protection sheet (2). The laser processing protection sheet (2) is provided on the laser beam incident surface side of the article to be processed (1) when the article (1) is processed by the UV absorption ablation of the laser beam (7).

16 Claims, 3 Drawing Sheets

U.S. PATENT DOCUMENTS

| | | | |
|---|---|---|---|
| 5,278,199 A | | 1/1994 | Ohkawa et al. |
| 5,460,921 A | * | 10/1995 | Cywar et al. .................. 216/65 |
| 5,493,096 A | * | 2/1996 | Koh ...................... 219/121.71 |
| 5,538,789 A | * | 7/1996 | Capote et al. ............... 428/344 |
| 5,981,145 A | * | 11/1999 | Ding et al. ................ 525/327.7 |
| 6,255,405 B1 | * | 7/2001 | Kang et al. ............... 525/327.4 |
| 6,258,426 B1 | | 7/2001 | Yamamoto et al. |
| 6,413,839 B1 | | 7/2002 | Brown et al. |
| 6,444,310 B1 | | 9/2002 | Senoo et al. |
| 6,596,968 B2 | * | 7/2003 | Yamamoto et al. ..... 219/121.71 |
| 6,610,960 B2 | * | 8/2003 | De Steur et al. ....... 219/121.71 |
| 6,811,888 B2 | * | 11/2004 | Hamann et al. ........ 219/121.71 |
| 6,864,459 B2 | * | 3/2005 | Chang et al. ........... 219/121.71 |
| 2002/0104831 A1 | | 8/2002 | Chang et al. |
| 2002/0127824 A1 | | 9/2002 | Shelton et al. |
| 2003/0108762 A1 | | 6/2003 | Hamann et al. |
| 2003/0207062 A1 | | 11/2003 | Herzog et al. |
| 2003/0226832 A1 | | 12/2003 | Liu et al. |
| 2004/0048054 A1 | * | 3/2004 | Tobita et al. ................ 428/219 |
| 2005/0003635 A1 | | 1/2005 | Takekoshi |
| 2005/0029238 A1 | * | 2/2005 | Chen ..................... 219/121.71 |
| 2005/0242073 A1 | * | 11/2005 | Nakamura et al. ..... 219/121.72 |
| 2006/0157191 A1 | | 7/2006 | Matsuo et al. |
| 2006/0228650 A1 | | 10/2006 | Matsuo et al. |
| 2006/0246279 A1 | | 11/2006 | Urairi et al. |

FOREIGN PATENT DOCUMENTS

| | | | |
|---|---|---|---|
| EP | 1 634 673 | | 3/2006 |
| JP | 5-330046 A | | 12/1993 |
| JP | 6-163687 | | 6/1994 |
| JP | 6-170822 | | 6/1994 |
| JP | 7-168386 | | 7/1995 |
| JP | 9-136421 A | | 5/1997 |
| JP | 9-188854 | | 7/1997 |
| JP | 2000-104026 | | 4/2000 |
| JP | 2001-323075 A | | 11/2001 |
| JP | 2002-105221 A | * | 4/2002 |
| JP | 2002-134921 A | * | 5/2002 |
| JP | 2002-322438 A | | 11/2002 |
| JP | 2002-338911 A | | 11/2002 |
| JP | 2002-338911 A | * | 11/2002 |
| JP | 2002-343747 | | 11/2002 |
| JP | 2002-343747 A | | 11/2002 |
| JP | 2003-23230 A | | 1/2003 |
| JP | 2003-34780 A | | 2/2003 |
| JP | 2003-113355 | | 4/2003 |
| JP | 2003-211277 | | 7/2003 |
| JP | 2004-91547 | | 3/2004 |
| JP | 2004-322157 | | 11/2004 |
| JP | 2005-186109 | | 7/2005 |
| JP | 2005-186110 | | 7/2005 |
| JP | 2005-187619 | | 7/2005 |
| JP | 2005-279676 | | 10/2005 |
| JP | 2005-279680 | | 10/2005 |
| JP | 2005-279682 | | 10/2005 |
| JP | 2005-279692 | | 10/2005 |
| JP | 2005-279696 | | 10/2005 |
| JP | 2005-279698 | | 10/2005 |
| JP | 2005-279749 | | 10/2005 |
| JP | 2005-279752 | | 10/2005 |
| JP | 2005-279754 | | 10/2005 |
| JP | 2005-279755 | | 10/2005 |
| JP | 2005-279757 | | 10/2005 |
| JP | 2005-279758 | | 10/2005 |
| JP | 2006-192474 | | 7/2006 |
| JP | 2006-192478 | | 7/2006 |
| WO | WO 01/41968 | | 6/2001 |
| WO | WO 2004/096483 | | 11/2004 |
| WO | WO 2005/063435 | | 7/2005 |

OTHER PUBLICATIONS

International Search Report issued on the related PCT Application No. PCT/JP2004/005554, dated Aug. 10, 2004.

International Search Report issued on the corresponding PCT Application No. PCT/JP2004/016268, dated Feb. 15, 2005.

File History of the related U.S. Appl. No. 10/554,540, as of Oct. 13, 2008.

File History of the related U.S. Appl. No. 11/331,465, as of Oct. 13, 2008.

File History of the related U.S. Appl. No. 11/331,674, as of Oct. 13, 2008.

Supplementary European Search Report issued on the corresponding European Patent Application No. 04799471, dated Oct. 2, 2008.

File History of the related U.S. Appl. No. 10/554,540, for the period of Oct. 14, 2008-Apr. 6, 2009.

File History of the related U.S. Appl. No. 11/331,465, for the period of Oct. 14, 2008-Apr. 6, 2009.

File History of the related U.S. Appl. No. 11/331,674, for the period of Oct. 14, 2008-Apr. 6, 2009.

Japanese Office Action issued on the corresponding Japanese Patent Application No. 2003-430451, dated Jun. 24, 2009.

* cited by examiner

[FIG. 1]
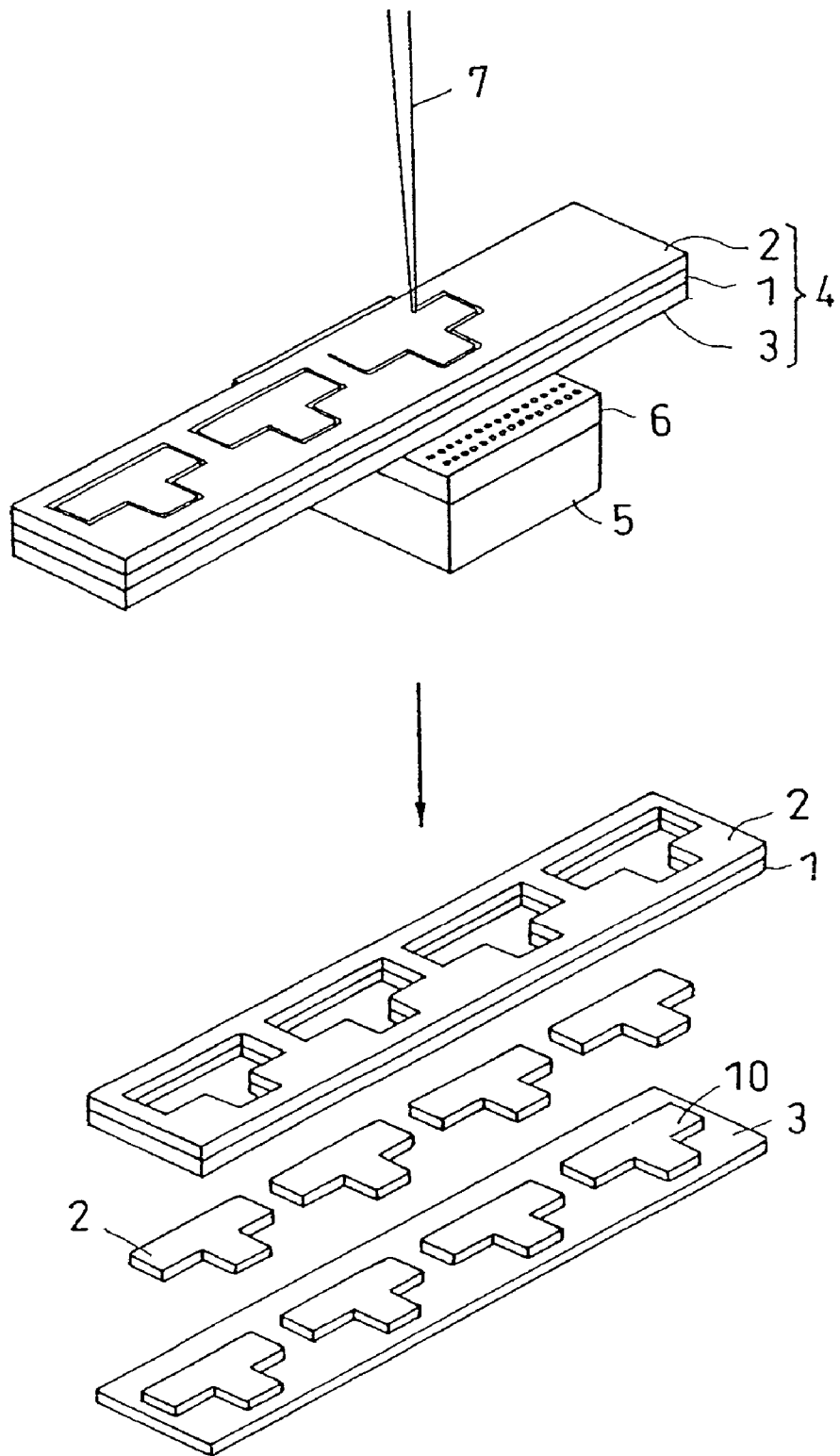

[FIG. 2]
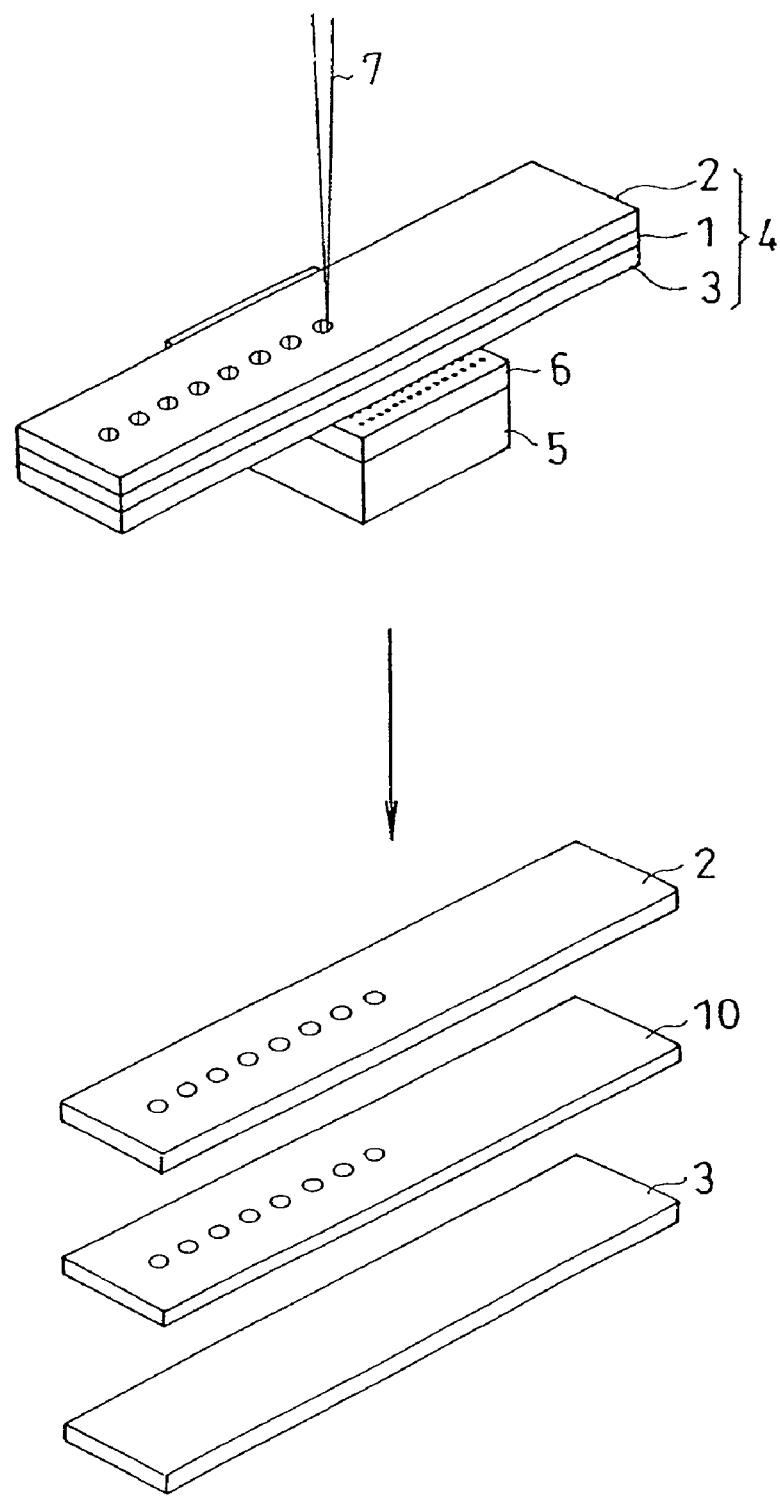

[FIG. 3]
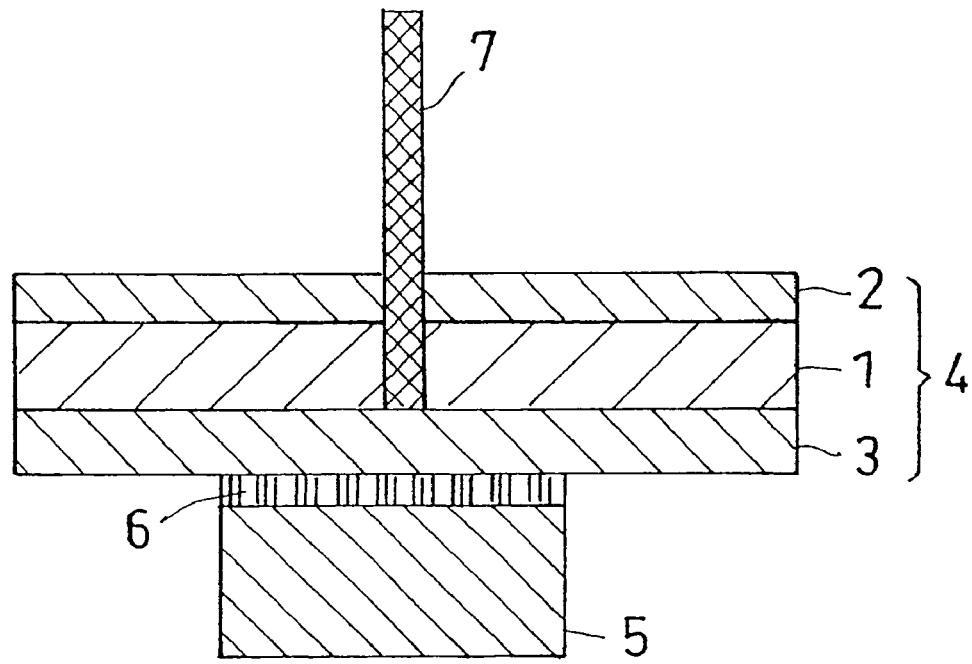
[FIG. 4]
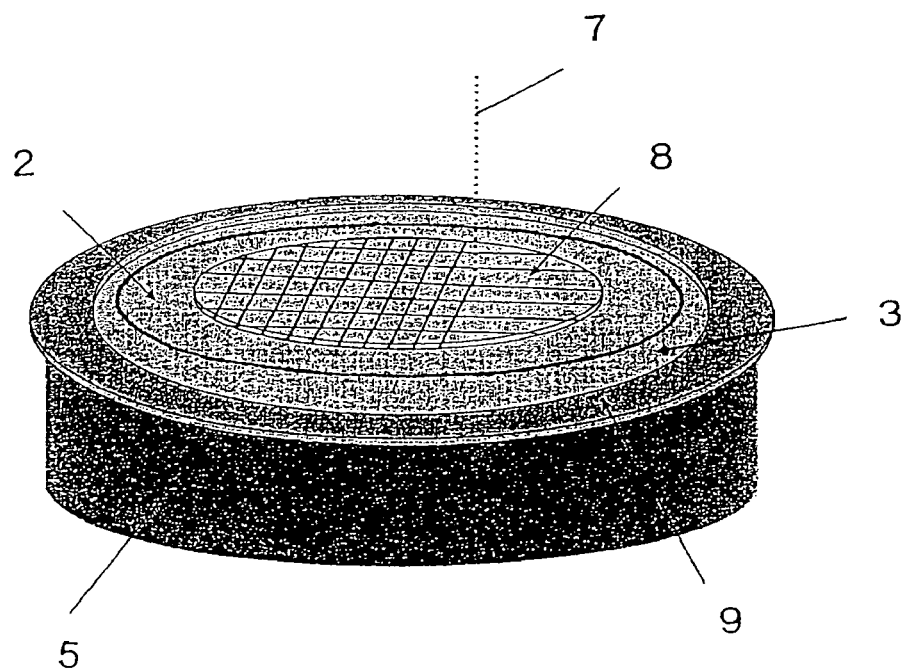

PROTECTIVE SHEET FOR LASER PROCESSING AND MANUFACTURING METHOD OF LASER PROCESSED PARTS

This application is the U.S. National Phase under 35 U.S.C. §371 of International Application PCT/JP2004/016268, filed Nov. 2, 2004, which claims priority to Japanese Patent Application No. 2003-430463, filed Dec. 25, 2003, Japanese Patent Application No. 2003-430451, filed Dec. 25, 2003, Japanese Patent Application No. 2004-100141, filed Mar. 30, 2004, Japanese Patent Application No. 2004-100199, filed Mar. 30, 2004, Japanese Patent Application No. 2004-100127, filed Mar. 30, 2004, Japanese Patent Application No. 2004-099896, filed Mar. 30, 2004, Japanese Patent Application No. 2004-100112, filed Mar. 30, 2004, and Japanese Patent Application No. 2004-100281, filed Mar. 30, 2004. The International Application was not published under PCT Article 21(2) in English.

TECHNICAL FIELD

The present invention relates to a protective sheet for laser processing used when processing a workpiece by ultraviolet absorption ablation by laser beam. The invention also relates to a manufacturing method of laser processed parts obtained by processing workpieces such as sheet material, circuit board, semiconductor wafer, glass substrate, ceramic substrate, metal substrate, semiconductor laser or other light emitting and light detecting element board, MEMS board, semiconductor package, cloth, leather, paper or the like, by cutting, drilling, marking, grooving, scribing, trimming or other shaping process by ultraviolet absorption ablation by laser beam.

BACKGROUND ART

As the electronic and electric appliances are reduced in size recently, component parts are also reduced in size and advanced in definition, and high definition and high precision are demanded in machining of parts at machining precision of +/−50 μm or less. In the conventional press processing or blanking process, the precision is about +/−100 μm at most, and such demand cannot be satisfied. Drilling of materials is also demanded to conform to high definition and high precision, and drilling by using conventional drill or die cannot meet the needs.

To solve the problems, lately, machining of materials by using laser beam is attracting wide attention. In particular, the machining method by ultraviolet absorption ablation of laser beam of small heat damage and high definition is noticed as precise outline processing method or fine drilling method.

As the background art, for example, the dicing method of workpiece includes a method of dicing the workpiece by laser beam while supporting and fixing the workpiece on a dicing sheet (Japanese Laid-open Patent No. 2002-343747). Also proposed is a method of dicing a semiconductor wafer by combining laser with water micro jet (Japanese Laid-open Patent No. 2003-34780). The dicing sheet mentioned in these patent publications is disposed at the exit side of laser beam of the workpiece, and is used for supporting and fixing the workpiece (to be processed by laser) during dicing and in the subsequent processes.

When laser beam is used, it requires aftertreatment called desmearing in order to remove deposits of decomposition products of carbon or the like generated by laser processing from the surface of workpiece. The sticking strength of decomposition products is firm in proportion to power of laser beam, and when the power of laser beam is increased, it is difficult to remove deposits in aftertreatment. In particular, at the side contacting with the processing table of workpiece or adhesive sheet (the laser beam exist side) is likely to be coated not only with the decomposition products of workpiece but also with decomposition products of processing table and adhesive sheet. As a result, improvement of throughput of processing is impeded, or reliability of cutting or drilling is lowered.

SUMMARY OF THE INVENTION

It is hence an object of the invention to present a protective sheet for laser processing capable of effectively suppressing contamination of workpiece surface by decomposition products when processing the workpiece by ultraviolet absorption ablation of laser beam. It is a further object of the invention to present a manufacturing method of laser processed parts by using a protective sheet for laser processing capable of effectively suppressing contamination of workpiece surface by decomposition products when processing the workpiece by ultraviolet absorption ablation of laser beam, and also processing at high precision.

The present inventors have intensively accumulated studies in order to solve the problems, and have completed the invention by discovering that the objects can be achieved by using the following protective sheet for laser processing (hereafter called protective sheet) and the manufacturing method of laser processed parts by using the protective sheet.

That is, a first aspect of the invention relates to a protective sheet for laser processing disposed at the incident side of laser beam of workpiece when processing the workpiece by ultraviolet absorption ablation of laser beam.

The protective sheet is laminated at the incident side of laser beam of workpiece (laser beam irradiation side) before laser processing of workpiece by ultraviolet absorption ablation of laser beam, and is used for protecting the workpiece surface from decomposition products and scattering matter generated by ablation. The protective sheet is processed together with the workpiece by ultraviolet absorption ablation of laser beam. By using the protective sheet, decomposition products generated from the laser beam irradiation parts stick to the surface of the protective sheet which covers the workpiece, and sticking of decomposition products to the workpiece surface can be effectively prevented.

The light transmissivity of the protective sheet in the laser beam absorption region is preferred to be less than 50%. By using the protective sheet of which light transmissivity is less than 50%, it is effective to prevent decomposition products from invading into the interface of protective sheet and workpiece to stick to the interface area. As a result, the protective sheet can be easily peeled off from the workpiece after laser processing, and the laser processing precision of workpiece can be enhanced at the same time.

By using the protective sheet, contamination of interface area by decomposition products can be suppressed, and its reason is estimated as follows. When the light transmissivity of the protective sheet in the laser beam absorption region is less than 50%, laser energy utilization efficiency of protective sheet is great, and the protective sheet is eroded by the laser beam earlier than the workpiece. After erosion of laser beam irradiation area of protective sheet, its lower layer, that is, the workpiece is eroded, but since decomposition products of workpiece are effectively scattered outside from the eroded portions of the protective sheet, contamination of interface area of the protective sheet and workpiece can be suppressed.

More preferably, the light transmissivity of the protective sheet in the laser beam absorption region should be less than 40%, and further preferably less than 30%, and most preferably 0%. On the other hand, when the light transmissivity is more than 50%, the energy transmission increases to the workpiece which is a light energy absorber, and erosion of workpiece by laser beam transmitting through the protective sheet tends to be progressed before the protective sheet is eroded by the laser beam. In such a case, since there is no route of scattering for decomposition products produced by erosion of workpiece, decomposition products may invade into the space between the protective sheet and workpiece, and the surface of workpiece may be contaminated. That is, unless the protective sheet is ruptured or pierced by laser ablation, since the gas pressure in decomposition of workpiece is high, gaseous decomposition products are stagnant between the protective sheet and workpiece, and such decomposition products contaminate the workpiece surface. If the workpiece surface is contaminated, it is hard to peel off the protective sheet from the workpiece after laser processing of workpiece, and the processing precision of workpiece tends to be lower.

The protective sheet is preferred to be provided with an adhesive layer on a base material. When the protective sheet is provided with adhesiveness, the contact tightness of the protective sheet and workpiece is increased, and invasion of decomposition products into the interface can be suppressed. As a result, contamination of workpiece surface by decomposition products can be suppressed.

Also in the first aspect of the invention, the base material is preferred to contain an aromatic polymer. By using an aromatic polymer as forming material of base material, the light transmissivity in the laser beam absorption region can be lowered, and the etching speed of the protective sheet can be raised.

The ratio by weight of aromatic ring in repetition units for composing the aromatic polymer is preferred to be 41 wt % or more, and more preferably 50 wt % or more. If the ratio by weight of aromatic ring is less than 41 wt %, the light transmissivity in the laser beam absorption region cannot be lowered sufficiently, and it tends to be difficult to enhance the etching speed of protective sheet sufficiently.

A second aspect of the invention relates to a protective sheet for laser processing used when processing the workpiece by ultraviolet absorption ablation of laser beam, in which the protective sheet is provided at least with an adhesive layer on the base material, and the etching rate of the base material (etching speed/energy fluence) is 0.4 [(μm/pulse)/(J/cm$^2$)] or more.

The etching rate calculated by dividing the etching speed (μm/pulse) of the base material by the energy fluence (J/cm$^2$) of the laser shows the degree of laser processability of base material, and when the etching rate is higher, it is easier to etch. The calculating method of the etching rate is specifically described in the embodiment.

In the second aspect of the invention, by using the protective sheet of which etching rate of base material is 0.4 or more, contamination of workpiece surface by decomposition products can be suppressed effectively. Its reason is estimated as follows. When the etching rate of base material is more than 0.4, since the laser energy utilization efficiency of base material is great, the base material is etched by the laser beam earlier than the workpiece. After etching of the laser beam irradiation part of protective sheet, the workpiece in the lower layer is etched, but since the decomposition products of workpiece effectively scatter about to outside from the etching area of the protective sheet, they hardly invade into the interface of protective sheet and workpiece, so that contamination of workpiece surface can be suppressed.

The etching rate of the base material is preferred to be 0.5 or more, or more preferably 0.6 or more. If the etching rate is less than 0.4, the energy transmission increases to the workpiece which is a light energy absorber, and etching of workpiece by laser beam transmitting through the protective sheet is progressed before the base material is sufficiently etched by the laser beam. In such a case, since there is no route of scattering for decomposition products produced by etching of workpiece, decomposition products may invade into the interface area between the protective sheet and workpiece, and the surface of workpiece may be contaminated. When the workpiece surface is contaminated by decomposition products, as mentioned above, it is hard to peel off the protective sheet from the workpiece after laser processing of workpiece, and it is hard to remove decomposition products in aftertreatment, and the processing precision of workpiece tends to be lower.

The protective sheet is preferred to be provided with an adhesive layer at least on a base material. When the protective sheet is provided with adhesiveness, the contact tightness at the interface of the protective sheet and workpiece is increased, and invasion of decomposition products into the interface can be suppressed, and as a result, contamination of workpiece surface by decomposition products can be suppressed.

Also in the second aspect of the invention, the base material is preferred to contain an aromatic polymer or silicone rubber. By using an aromatic polymer or silicone rubber as forming material of base material, it is easier to adjust the etching rate of base material to 0.4 or more.

The invention also relates to a manufacturing method of laser processed parts comprising a step of disposing a protective sheet for laser processing at the incident side of laser beam of a workpiece (1), a step of processing the protective sheet for laser processing and the workpiece by irradiating with laser beam (2), and a step of peeling the protective sheet for laser processing from the workpiece after processing (3).

The workpiece is preferably any one of sheet material, circuit board, semiconductor wafer, glass substrate, ceramic substrate, metal substrate, semiconductor laser light emitting or light detecting element board, MEMS board, and semiconductor package. The processing is cutting or drilling process of workpiece.

The protective sheet of the invention is preferably used in manufacture of semiconductor chip, especially, by dicing a semiconductor wafer.

A third aspect of the invention relates to a manufacturing method of laser processed parts by using a protective sheet for laser processing having at least an adhesive layer on a base material, with 1 or more of ratio of extinction coefficient at ultraviolet region wavelength λ of base material to extinction coefficient at ultraviolet region wavelength λ of workpiece (extinction coefficient ratio=extinction coefficient at ultraviolet region wavelength λ of base material of protective sheet for laser processing/extinction coefficient at ultraviolet region wavelength λ of workpiece), comprising a step of adhering an adhesive layer of protective sheet for laser processing to the incident side of laser beam of workpiece, a step of processing the protective sheet for laser processing and workpiece by irradiating with laser beam, and a step of peeling off the protective sheet for laser processing from the workpiece after processing.

In the manufacturing method of the third aspect of the invention, it is important to select and use the protective sheet of which ratio of extinction coefficient at ultraviolet region wavelength λ of base material to extinction coefficient at ultraviolet region wavelength λ of workpiece (extinction coefficient ratio=extinction coefficient at ultraviolet region wavelength λ of base material of protective sheet for laser processing/extinction coefficient at ultraviolet region wavelength λ of workpiece) is 1 or more. The inventors discovered a correlation between the extinction coefficient and laser processability, and found that contamination of workpiece surface by decomposition products can be effectively suppressed by using a protective sheet with the extinction coefficient ratio of 1 or more. The ultraviolet region wavelength λ is preferred to be 355 nm.

The extinction coefficient is an important parameter in relation to the laser processability of base material of protective sheet and workpiece. When the extinction coefficient of a solid matter at a certain wavelength is smaller, the absorption of light energy is smaller. That is, light absorption in a solid matter occurs at light invasion length (effective distance from solid matter surface: 1/extinction coefficient), and when the extinction coefficient is small, the light invasion length is longer, and hence the accumulated energy per volume is decreased. As a result, laser processing is difficult in a material of small extinction coefficient.

As in the third aspect of the invention, by using the protective sheet of which extinction coefficient ratio is 1 or more, the laser beam invasion length in the base material is set shorter than the laser beam invasion length in the workpiece. Hence, the absorption of light energy is greater in the base material than in the workpiece, so that laser processing is easier.

By using the protective sheet of which extinction coefficient ratio is 1 or more, contamination of workpiece surface by decomposition products can be effectively suppressed, and its reason may be estimated as follows. The protective sheet of which extinction coefficient ratio is 1 or more is equivalent or superior in laser processability to the workpiece, and it is etched by laser beam at the same time as or earlier than the workpiece. Accordingly, the decomposition products of workpiece are effectively scattered to outside from the etching portion of the protective sheet, and hardly invade into the interface of protective sheet and workpiece. As a result, contamination of workpiece surface can be suppressed effectively.

The extinction coefficient ratio is preferred to be 1.5 or more, or more preferably 2 or more. If the extinction coefficient ratio is less than 1, etching of workpiece is advanced before the protective sheet is cut or pierced. In such a case, there is no route of scattering for decomposition products produced by etching of workpiece, and the decomposition products may invade into the interface area of protective sheet and workpiece, and the workpiece surface may be contaminated. If the workpiece surface is thus contaminated by decomposition products, after laser processing of workpiece, it is hard to peel off the protective sheet from the workpiece, or it is hard to remove decomposition products in aftertreatment, and the processing precision of workpiece tends to be lower.

The base material is preferred to contain an aromatic polymer or silicone rubber. Since this material is large in the extinction coefficient at ultraviolet region wavelength λ, the extinction coefficient ratio can be adjusted to 1 or more relatively easily.

A fourth aspect of the invention relates to a manufacturing method of laser processed parts by using a protective sheet for laser processing having at least an adhesive layer on a base material, with the extinction coefficient at ultraviolet region wavelength λ of base material of 20 cm$^{-1}$ or more, comprising a step of adhering an adhesive layer of protective sheet for laser processing to the incident side of laser beam of metal material, a step of processing the protective sheet for laser processing and metal material by irradiating with laser beam, and a step of peeling off the protective sheet for laser processing from the metal material after processing.

In particular, when processing a metal material, it is difficult to measure the extinction coefficient of metal material. However, by controlling the extinction coefficient at ultraviolet region wavelength λ of base material of protective sheet at 20 cm$^{-1}$ or more, contamination of surface of metal material by decomposition products could be suppressed effectively. The extinction coefficient at ultraviolet region wavelength λ of base material is preferred to be 50 cm$^{-1}$ or more, or more preferably 80 cm$^{-1}$ or more. The ultraviolet region wavelength λ is preferred to be 355 nm.

A fifth aspect of the invention relates to a manufacturing method of laser processed parts by using a protective sheet for laser processing having at least an adhesive layer on a base material, with 1 or more of ratio of density of base material to density of workpiece (density ratio=density of base material of protective sheet for laser processing/density of workpiece), comprising a step of adhering an adhesive layer of protective sheet for laser processing to the incident side of laser beam of workpiece, a step of processing the protective sheet for laser processing and workpiece by irradiating with laser beam, and a step of peeling off the protective sheet for laser processing from the workpiece after processing.

In the manufacturing method of the fifth aspect of the invention, it is important to select and use the protective sheet of which ratio of density of base material to ratio of workpiece (density ratio=density of base material of protective sheet for laser processing/radio of workpiece) or 1 or more. The inventors discovered a correlation between the material density and laser processability, and found that the higher density is preferred because ablation is more likely to occur and laser processability is higher. By selecting and using the protective sheet of which density ratio is 1 or more, it is found more effective to suppress contamination of workpiece surface by decomposition products. The reason of correlation between density and laser processability is not clear, but the material of large density is high in filling rate of atoms, and the probability of laser beam colliding against atoms per unit area of irradiation seems to be higher. Ultraviolet ablation of laser beam is a phenomenon of a substance absorbing photons to excite electrons, thereby segmenting coupling between atoms. It is hence considered that laser processing is easier when the photon absorption sectional area of laser beam is wider (that is, the density is larger).

By selecting and using the protective sheet of which density ratio is 1 or more, contamination of workpiece surface by decomposition products can be suppressed effectively, and its reason is estimated as follows. The protective sheet with density ratio of 1 or more is equivalent or superior in laser processability to workpiece, and is etched by laser beam at the same time as or earlier than the workpiece. Hence, decomposition products of workpiece scatter effectively to outside from the etching portion of the protective sheet, and hardly invade into the interface of the protective sheet and workpiece. As a result, contamination of workpiece surface can be suppressed effectively.

The density ratio is preferred to be 1.1 or more, or more preferably 1.4 or more. If the density ratio is less than 1, etching of workpiece is advanced before the protective sheet is cut or pierced. In such a case, there is no route of scattering for decomposition products produced by etching of workpiece, and the decomposition products may invade into the interface area of protective sheet and workpiece, and the workpiece surface may be contaminated. If the workpiece surface is thus contaminated by decomposition products, after laser processing of workpiece, it is hard to peel off the protective sheet from the workpiece, or it is hard to remove decomposition products in aftertreatment, and the processing precision of workpiece tends to be lower.

The base material of the protective sheet is preferred to contain an aromatic polymer or silicone rubber from the viewpoint of high density.

A sixth aspect of the invention relates to a manufacturing method of laser processed parts by using a protective sheet for laser processing having at least an adhesive layer on a base material, with the density of base material of 1.1 g/cm$^3$ or more, comprising a step of adhering an adhesive layer of protective sheet for laser processing to the incident side of laser beam of metal material, a step of processing the protective sheet for laser processing and metal material by irradiating with laser beam, and a step of peeling off the protective sheet for laser processing from the metal material after processing.

In particular, in laser processing of metal material, if the density ratio is more than 1, etching of metal material may be advanced before the protective sheet is cut or pierced. In such a case, there is no route of scattering for decomposition products produced by etching of metal material, and the decomposition products may invade into the interface area of protective sheet and metal material, and the surface of metal material may be contaminated. As the cause of such phenomenon, difference in ablation process between macromolecular material and metal material may be considered. That is, the metal material undergoes a thermochemical reactive process derived from the heat generated by injection of light energy. Accordingly, the process efficiency of macromolecular material and process efficiency of metal material cannot be compared simply.

The inventors have comparatively studied between the processing rate of metal material such as silicon and processing rate of protective sheet, and found that the base material having the density of 1.1 g/cm$^3$ or more has a laser processability equivalent to that of metal material and can effectively suppress the contamination of surface of metal material by decomposition products. More preferably, the density of the base material should be 1.3 g/cm$^3$ or more, or most preferably 1.5 g/cm$^3$ or more.

The base material of the protective sheet is preferred to contain an aromatic polymer or silicone rubber from the viewpoint of high density.

A seventh aspect of the invention relates to a manufacturing method of laser processed parts by using a protective sheet for laser processing having at least an adhesive layer on a base material, with 1 or more of ratio of tensile strength of protective sheet for laser processing to tensile strength of workpiece (tensile strength ratio=tensile strength of protective sheet for laser processing/tensile strength of workpiece), comprising a step of adhering an adhesive layer of protective sheet for laser processing to the incident side of laser beam of workpiece, a step of processing the protective sheet for laser processing and workpiece by irradiating with laser beam, and a step of peeling off the protective sheet for laser processing from the workpiece after processing.

In the seventh aspect of the invention, it is important to select and use the protective sheet of which ratio of tensile strength of protective sheet to tensile strength of workpiece (tensile strength ratio=tensile strength of protective sheet for laser processing/tensile strength of workpiece) is 1 or more. The inventors discovered a correlation between the tensile strength, one of the mechanical properties, and the laser processability, and found that contamination of workpiece surface by decomposition products can be suppressed effectively by selecting and using the protective sheet of which tensile strength ratio is 1 or more. The reason of correlation between tensile strength and laser processability is not clear, but a material of high tensile strength often has aromatic or linear structure generally, and molecules having such rigid structure are strong in the intermolecular force by electrons of mutual cyclic atoms or hetero atoms and are hence arrayed. As a result, collision probability is high between atoms absorbing laser energy, and it is considered that laser processability may be enhanced.

Therefore, by selecting and using the protective sheet of which tensile strength ratio is 1 or more, contamination of workpiece surface by decomposition products can be suppressed effectively, and its reason is estimated as follows. The protective sheet of which tensile strength ratio is 1 or more is equivalent or superior in laser processability to workpiece, and is hence etched by laser beam at the same time as or earlier than the workpiece. As a result, decomposition products of workpiece efficiently scatter about to outside from the etching portion of the protective sheet, and hardly invade into the interface of protective sheet and workpiece. Hence, contamination of workpiece surface can be suppressed effectively.

The tensile strength ratio is preferred to be 2 or more, or more preferably 5 or more. If the tensile strength ratio is less than 1, the workpiece is etched before the protective sheet is cut or pierced. In such a case, there is no route of scattering for decomposition products produced by etching of workpiece, and decomposition products invade into the interface of the protective sheet and workpiece, possibly contaminating the workpiece surface. If the workpiece surface is contaminated by decomposition products, after laser processing of workpiece, it is hard to peel off the protective sheet from the workpiece, or it is difficult to remove decomposition products in aftertreatment, and the processing precision of workpiece tends to drop.

An eighth aspect of the invention relates to a manufacturing method of laser processed parts by using a protective sheet for laser processing having at least an adhesive layer on a base material, with the tensile strength of 100 MPa or more, comprising a step of adhering an adhesive layer of protective sheet for laser processing to the incident side of laser beam of metal material, a step of processing the protective sheet for laser processing and metal material by irradiating with laser beam, and a step of peeling off the protective sheet for laser processing from the metal material after processing.

In particular, in laser processing of metal material, if the tensile strength ratio is more than 1, etching of metal material may be advanced before the protective sheet is cut or pierced. In such a case, there is no route of scattering for decomposition products produced by etching of metal material, and the decomposition products may invade into the interface area of protective sheet and metal material, and the surface of metal material may be contaminated. As the cause of such phenomenon, difference in ablation process between macromolecular material and metal material may be considered. That is, the metal material undergoes a thermochemical reactive process derived from the heat generated by injection of light energy. Accordingly, the process efficiency of macromolecular material and process efficiency of metal material cannot be compared simply.

The inventors have comparatively studied between the processing rate of metal material such as silicon and processing rate of protective sheet, and found that the protective sheet having a tensile strength of 100 MPa or more has a laser processability equivalent to that of metal material and can effectively suppress the contamination of surface of metal material by decomposition products. More preferably, the tensile strength of protective sheet should be 120 MPa or more, more preferably 140 MPa or more, and most preferably 200 MPa.

A ninth aspect of the invention relates to a manufacturing method of laser processed parts by using a protective sheet for laser processing having at least an adhesive layer on a base material, with less than 1 of ratio of specific heat of base material to specific heat of workpiece (specific heat ratio=specific heat of base material of protective sheet for laser processing/specific heat of workpiece), comprising a step of adhering an adhesive layer of protective sheet for laser processing to the incident side of laser beam of workpiece, a step of processing the protective sheet for laser processing and workpiece by irradiating with laser beam, and a step of peeling off the protective sheet for laser processing from the workpiece after processing.

In the ninth aspect of the invention, it is important to select and use the protective sheet of which ratio of specific heat of base material to specific heat of workpiece (specific heat ratio=specific heat of base material of protective sheet for laser processing/specific heat of workpiece) of less than 1. The inventors discovered a correlation between the specific heat of material and the laser processability, and found that ablation is more likely to occur at smaller specific heat, so that laser processability is higher. That is, contamination of workpiece surface by decomposition products can be suppressed effectively by selecting and using the protective sheet of which specific heat ratio is less than 1. The reason of correlation between specific heat and laser processability is not clear, but ablation is considered to take place by a mechanism of inducing a Coulomb explosion as photons excite electrons in the material and a mechanism of decomposing the material thermally. When the specific heat of material is small, heat is absorbed and the temperature is likely to rise, and laser processability seems to be higher.

Further, by selecting and using the protective sheet of which specific heat ratio is less than 1, contamination of workpiece surface by decomposition products can be suppressed effectively, and its reason is estimated as follows. The protective sheet of which specific heat ratio is less than 1 is equivalent or superior in laser processability to workpiece, and is hence etched by laser beam at the same time as or earlier than the workpiece. As a result, decomposition products of workpiece efficiently scatter about to outside from the etching portion of the protective sheet, and hardly invade into the interface of protective sheet and workpiece. Hence, contamination of workpiece surface can be suppressed effectively.

The specific heat ratio is preferred to be 0.9 or less, or more preferably 0.8 or less. If the specific heat ratio is more than 1, the workpiece is etched before the protective sheet is cut or pierced. In such a case, there is no route of scattering for decomposition products produced by etching of workpiece, and decomposition products invade into the interface of the protective sheet and workpiece, possibly contaminating the workpiece surface. If the workpiece surface is contaminated by decomposition products, after laser processing of workpiece, it is hard to peel off the protective sheet from the workpiece, or it is difficult to remove decomposition products in aftertreatment, and the processing precision of workpiece tends to drop.

In the manufacturing method of laser processed parts of the invention in the third, fifth, seventh and ninth aspects, the workpiece is preferred to be any one of sheet material, circuit board, semiconductor wafer, glass substrate, ceramic substrate, metal substrate, semiconductor laser light emitting or light detecting element board, MEMS board, and semiconductor package.

In the manufacturing method of laser processed parts of the invention in the fourth, sixth and eighth aspects, the metal material is preferred to be semiconductor wafer or metal substrate.

A tenth aspect of the invention relates to a manufacturing method of laser processed parts by using a protective sheet for laser processing having at least an adhesive layer on a base material, with 1 or more of ratio of refractive index at wavelength 546 nm of base material to refractive index at wavelength 546 nm of organic workpiece (refractive index ratio=refractive index at wavelength 546 nm of base material of protective sheet for laser processing/refractive index at wavelength 546 nm of organic workpiece), comprising a step of adhering an adhesive layer of protective sheet for laser processing to the incident side of laser beam of organic workpiece, a step of processing the protective sheet for laser processing and organic workpiece by irradiating with laser beam, and a step of peeling off the protective sheet for laser processing from the organic workpiece after processing.

In the tenth aspect of the invention, it is important to select and use the protective sheet of which ratio of refractive index at wavelength 546 nm of base material to refractive index at wavelength 546 nm of organic workpiece (refractive index ratio=refractive index at wavelength 546 nm of base material of protective sheet for laser processing/refractive index at wavelength 546 nm of organic workpiece) is 1 or more. The inventors discovered a correlation between the refractive index and the laser processability, and found that contamination of surface of organic workpiece by decomposition products can be suppressed effectively by selecting and using the protective sheet of which refractive index ratio is more than 1.

The refractive index ratio is an important parameter for laser processability of base material of protective sheet and organic workpiece. The higher the refractive index of a solid matter at a certain wavelength, the slower is the speed of light propagating through the solid matter, and the probability of photo absorption is higher. Mechanism of occurrence of laser ablation is derived from electron excitation by photon absorption, and the laser processability is considered to be higher when the speed of light propagating in the solid matter is slower (that is, the refractive index is larger).

In the invention, by using the protective sheet of which refractive index ratio is 1 or more, photon absorption in the base material is greater than in the organic workpiece, and the base material is more likely to be processed by laser.

Further, by selecting and using the protective sheet of which refractive index ratio is more than 1, contamination of surface of organic workpiece by decomposition products can be suppressed effectively, and its reason is estimated as follows. The protective sheet of which refractive index ratio is more than 1 is equivalent or superior in laser processability to organic workpiece, and is hence etched by laser beam at the same time as or earlier than the organic workpiece. As a result, decomposition products of organic workpiece efficiently scatter about to outside from the etching portion of the protective sheet, and hardly invade into the interface of protective sheet and organic workpiece. Hence, contamination of surface of organic workpiece can be suppressed effectively.

The refractive index ratio is preferred to be more than 1.05, or more preferably more than 1.1, and most preferable more than 1.2. If the refractive index ratio is less than 1, the organic workpiece is etched before the protective sheet is cut or pierced. In such a case, there is no route of scattering for decomposition products produced by etching of organic workpiece, and decomposition products invade into the interface of the protective sheet and organic workpiece, possibly contaminating the surface of organic workpiece. If the surface of organic workpiece is contaminated by decomposition products, after laser processing of organic workpiece, it is hard to peel off the protective sheet from the organic workpiece, or it is difficult to remove decomposition products in aftertreatment, and the processing precision of organic workpiece tends to drop.

An eleventh aspect of the invention relates to a manufacturing method of laser processed parts by using a protective sheet for laser processing having at least an adhesive layer on a base material, with refractive index at wavelength 546 nm of base material of 1.53 or more, comprising a step of adhering an adhesive layer of protective sheet for laser processing to the incident side of laser beam of inorganic workpiece, a step of processing the protective sheet for laser processing and inorganic workpiece by irradiating with laser beam, and a step of peeling off the protective sheet for laser processing from the inorganic workpiece after processing.

In the invention, the inorganic workpiece is preferred to be any one of circuit board, semiconductor wafer, glass substrate, ceramic substrate, metal substrate, semiconductor laser light emitting or light detecting element board, MEMS board, and semiconductor package.

When using the inorganic workpiece, it is hard to measure its refractive index, but by defining the refractive index of base material of protective sheet at 1.53 or more, contamination of surface of inorganic workpiece by decomposition products can be effectively suppressed. The refractive index of base material is preferred to be 1.57 or more, or more preferably 1.60 or more.

In the invention, the base material of protective sheet is preferred to contain an aromatic polymer or silicone rubber. Since this material is large in refractive index at wavelength 546 nm, the refractive index ratio can be adjusted to more than 1 relatively easily.

A twelfth aspect of the invention relates to a manufacturing method of laser processed parts by using a protective sheet for laser processing having at least an adhesive layer on a base material, with less than 1 of ratio of total coupling energy ratio (total coupling energy ratio=total coupling energy A equivalent to minimum value among sums of coupling energy of one carbon atom in resin component for composing a base material and other atom coupled with the carbon atom/total coupling energy B equivalent to minimum value among sums of coupling energy of one carbon atom in material component for composing an organic workpiece and other atom coupled with the carbon atom), comprising a step of adhering an adhesive layer of protective sheet for laser processing to the incident side of laser beam of organic workpiece, a step of processing the protective sheet for laser processing and organic workpiece by irradiating with laser beam, and a step of peeling off the protective sheet for laser processing from the organic workpiece after processing.

In the manufacturing method of the twelfth aspect of the invention, it is important to select and use the protective sheet of which total coupling energy ratio is less than 1.

Herein, the total coupling energy A is the smallest value among sums of coupling energies (total coupling energy) of one carbon atom in resin component for composing a base material and other atom coupled with the carbon atom. A certain carbon atom in polymer is coupled with two or more other atoms, and the coupling energy varies with the kind of other atom being coupled, and hence the sum of coupling energies (total coupling energy) also differs with the coupling state of each carbon atom. In the invention, paying attention to the carbon atom of lowest total coupling energy among carbon atoms in various coupled states in the polymer, it is found that the total coupling energy A of the carbon atom has a correlation with the laser processability.

The total coupling energy B is the smallest value among sums of coupling energies (total coupling energy) of one carbon atom in material component for composing an organic workpiece and other atom coupled with the carbon atom. In the invention, paying attention to the carbon atom of lowest total coupling energy among carbon atoms in various coupled states in the material component, it is found that the total coupling energy B of the carbon atom has a correlation with the laser processability.

The authors have discovered that contamination of surface of organic workpiece by decomposition products can be effectively suppressed by selecting and using a protective sheet of which total coupling energy ratio is less than 1. The reason of such correlation between total coupling energy and laser processability is not clear, but the bond of atoms with small coupling energy is likely to be broken with irradiated with laser, and the threshold of processing drops. It is hence considered that the laser processability is higher when the total coupling energy is smaller between specific atoms in the material.

Further, by selecting and using the protective sheet of which total coupling energy ratio is less than 1, contamination of surface of organic workpiece by decomposition products can be suppressed effectively, and its reason is estimated as follows. The protective sheet of which total coupling energy ratio is less than 1 is equivalent or superior in laser processability to organic workpiece, and is hence etched by laser beam at the same time as or earlier than the organic workpiece. As a result, decomposition products of organic workpiece efficiently scatter about to outside from the etching portion of the protective sheet, and hardly invade into the interface of protective sheet and organic workpiece. Hence, contamination of surface of organic workpiece can be suppressed effectively.

The total coupling energy ratio is preferred to be 0.9 or less, or more preferably 0.8 or less. If the total coupling energy ratio is more than 1, the organic workpiece is etched before the protective sheet is cut or pierced. In such a case, there is no route of scattering for decomposition products produced by etching of organic workpiece, and decomposition products invade into the interface of the protective sheet and organic workpiece, possibly contaminating the surface of organic workpiece. If the surface of organic workpiece is contaminated by decomposition products, after laser processing of organic workpiece, it is hard to peel off the protective sheet from the organic workpiece, or it is difficult to remove decomposition products in aftertreatment, and the processing precision of organic workpiece tends to drop.

A thirteenth aspect of the invention relates to a manufacturing method of laser processed parts by using a protective sheet for laser processing having at least an adhesive layer on a base material, with total coupling energy A equivalent to minimum value among sums of coupling energy of one carbon atom in resin component for composing a base material and other atom coupled with the carbon atom of less than 800 kJ/mol, comprising a step of adhering an adhesive layer of protective sheet for laser processing to the incident side of laser beam of inorganic workpiece, a step of processing the protective sheet for laser processing and inorganic workpiece by irradiating with laser beam, and a step of peeling off the protective sheet for laser processing from the inorganic workpiece after processing.

In the invention, the inorganic workpiece is preferred to be any one of circuit board, semiconductor wafer, glass substrate, ceramic substrate, metal substrate, semiconductor laser light emitting or light detecting element board, MEMS board, and semiconductor package.

When using the inorganic workpiece, there is a thermochemical reactive process derived from heat generated by injection of light energy. That is, the ablation process varies significantly between inorganic workpiece and organic workpiece. Hence, processing efficiency of organic workpiece and processing efficiency of inorganic workpiece cannot be compared simply.

The inventors have comparatively studied the processing rate of inorganic workpiece and processing rate of organic workpiece, and discovered that contamination of surface of inorganic workpiece by decomposition products can be effectively suppressed by using the protective sheet having a base material of which total coupling energy A is less than 800 kJ/mol because it has a laser processability equivalent or superior to that of inorganic workpiece. The total coupling energy A is preferred to be 780 kJ/mol or less, or more preferably 760 kJ/mol or less.

In the third to thirteenth aspects of the invention, the protective sheet is laminated at the incident side of laser beam of workpiece (laser beam incident side) before laser processing of workpiece by ultraviolet absorption ablation of laser beam, and is used for protecting the surface of the workpiece from decomposition products or scattering matter generated by ablation.

As the protective sheet, one having at least an adhesive layer on a base material is used. By providing the protective sheet with adhesiveness, the contact tightness with the interface of protective sheet and workpiece is improved, and invasion of decomposition products into interface can be suppressed, so that contamination of surface of workpiece by decomposition products can be suppressed.

In the third to thirteenth aspects of the invention, the base material is preferred to contain an aromatic polymer or silicone rubber.

In the third to thirteenth aspects of the invention, the processing is cutting or drilling.

The invention relates to the protective sheet for laser processing used in manufacturing method of laser processed parts. The protective sheet is preferably used when manufacturing semiconductor chips, in particular, by dicing a semiconductor wafer.

BRIEF DESCRIPTION OF THE DRAWINGS

FIG. 1 is a schematic process diagram showing an example of manufacturing method of laser processed parts according to the invention.

FIG. 2 is a schematic process diagram showing other example of manufacturing method of laser processed parts according to the invention.

FIG. 3 is a schematic diagram showing a section of a laminated body processed by ultraviolet absorption ablation of laser beam.

FIG. 4 is a schematic diagram showing an example of dicing method of semiconductor wafer.

BEST MODE FOR CARRYING OUT THE INVENTION

The laser used in the invention is the laser applicable in ablation process by ultraviolet absorption, which is non-thermal process without heating process, in order not to worsen the precision and appearance of hole edge and cut section wall of workpiece due to thermal damage during laser processing. In particular, it is preferred to use the laser capable of focusing the laser beam into a narrow width of 20 $\lambda$m or less and emitting ultraviolet rays of 400 nm or less.

In particular, the laser used in the third and fourth aspects of the invention is the laser applicable in ablation process by ultraviolet absorption, and capable of emitting ultraviolet rays at specific wavelength $\lambda$. It is further preferred to use the laser capable of focusing the laser beam into a narrow width of 20 $\mu$m or less and emitting ultraviolet rays of 355 nm.

More specifically, the laser having oscillation wavelength of 400 nm or less is preferred, such as KrF excimer laser of oscillation wavelength 248 nm, XeCl excimer laser of 308 nm, and YAG laser having third harmonic wave (355 nm), fourth harmonic wave (266 nm), or wavelength of 400 nm or more, and in the case of such laser, light absorption of ultraviolet region passing through multi-photon absorption process is possible, and further examples include titanium sapphire laser around wavelength of 750 to 800 nm capable of cutting in a width of 20 $\mu$m or less by multi-photon absorption ablation, and laser with pulse width of $1e^{-9}$ sec (0.000000001) or less.

The workpiece is not particularly specified as far as it can be processed by ultraviolet absorption ablation of laser beam emitted from the laser, and may include, among others, sheet material, circuit board, semiconductor wafer, glass substrate, ceramic substrate, metal substrate, semiconductor laser or other light emitting or light detecting element board, MEMS (micro electro mechanical system) board, semiconductor package, cloth, leather, and paper.

The protective sheet and manufacturing method of the invention are preferably applied particularly in processing of sheet material, circuit board, semiconductor wafer, glass substrate, ceramic substrate, metal substrate, semiconductor laser light emitting or light detecting element board, MEMS board, and semiconductor package.

Various sheet materials include, for example, macromolecular films and nonwoven cloths made of polyimide resin, polyester resin, epoxy resin, urethane resin, polystyrene resin, polyethylene resin, polyamide resin, polycarbonate resin, silicone resin, fluorine resin, etc., and further sheets made of such resins provided with physical or optical functions by drawing, impregnation or other processes, metal sheets of copper, aluminum, stainless steel, and others, and the macromolecular film and/or metal sheet laminated directly or by way of adhesive or the like.

Examples of the circuit board include one-side, double-side or multi-layer flexible printed board, rigid board of glass epoxy, ceramic or metal core substrate, and optical circuit or opto-electrical mixed circuit board formed on glass or polymer.

Metal materials include both semimetals and alloys, for example, gold, SUS, copper, iron, aluminum, stainless steel, silicon, titanium, nickel, tungsten, and their processed materials (semiconductor wafer, metal board, etc.).

In the tenth and twelfth aspects of the invention, the organic workpiece is not particularly specified as far as it can be processed by ultraviolet absorption ablation of laser beam emitted from the laser, and may include, among others, sheet material, cloth, leather, and paper.

Various sheet materials include, for example, macromolecular films and nonwoven cloths, and sheets made of such resins provided with physical or optical functions by drawing, impregnation or other processes.

In the eleventh and thirteenth aspects of the invention, the inorganic workpiece is not particularly specified as far as it can be processed by ultraviolet absorption ablation of laser beam emitted from the laser, and may include, among others, circuit board, semiconductor wafer, glass substrate, ceramic substrate, metal substrate, semiconductor laser or other light emitting or light detecting element board, MEMS board, and semiconductor package.

Metal materials include both semimetals and alloys, for example, gold, SUS, copper, iron, aluminum, stainless, silicon, titanium, nickel, tungsten, and their processed materials.

The protective sheet of the invention is a sheet used when processing the workpiece by ultraviolet ablation of laser beam.

The protective sheet in the first aspect of the invention is preferred to be less than 50% in the light transmissivity in the laser beam (ultraviolet ray) absorption region. The protective sheet may be formed of base material alone, or may have an adhesive layer provided on the base material.

The protective sheet in the second aspect of the invention has at least an adhesive layer provided on a base material, and the etching rate of the base material is 0.4 [(µm/pulse)/(J/cm$^2$)] or more.

In the third aspect of the invention, a protective sheet having at least an adhesive layer on a base material is used. It is necessary to select and use a protective sheet of which extinction coefficient ratio is 1 or more. On the other hand, in the case of laser processing of metal material (fourth aspect of the invention), it is necessary to select and use a protective sheet having a base material of which extinction coefficient in ultraviolet region wavelength λ of 20 cm$^{-1}$ or more.

In the manufacturing method of laser processed parts according to the fifth aspect of the invention, a protective sheet having at least an adhesive layer on a base material is used. It is necessary to select and use a protective sheet of which density ratio is 1 or more. On the other hand, in the case of laser processing of metal material (sixth aspect of the invention), it is necessary to select and use a protective sheet having a base material of which density is 1.1 g/cm$^3$ or more.

In the manufacturing method of laser processed parts according to the seventh aspect of the invention, a protective sheet having at least an adhesive layer on a base material is used. It is necessary to select and use a protective sheet of which ratio of tensile strength of protective sheet to tensile strength of workpiece (tensile strength ratio=tensile strength of protective sheet/tensile strength of workpiece) is 1 or more. On the other hand, in the case of laser processing of metal material (eighth aspect of the invention), it is necessary to select and use a protective sheet having a base material of which tensile strength is 100 MPa or more.

In the manufacturing method of laser processed parts according to the ninth aspect of the invention, a protective sheet having at least an adhesive layer on a base material is used. It is necessary to select and use a protective sheet of which specific heat ratio is less than 1.

In the manufacturing method of laser processed parts according to the tenth aspect of the invention, a protective sheet having at least an adhesive layer on a base material is used. It is necessary to select and use a protective sheet of which refractive index ratio is 1 or more in the case of laser processing of organic workpiece. On the other hand, in the case of laser processing of inorganic workpiece (eleventh aspect of the invention), it is necessary to select and use a protective sheet having a base material of which refractive index at wavelength 546 nm is 1.53 or more.

In the manufacturing method of laser processed parts according to the twelfth aspect of the invention, a protective sheet having at least an adhesive layer on a base material is used. It is necessary to select and use a protective sheet of which total coupling energy ratio is less than 1 in the case of laser processing of organic workpiece. On the other hand, in the case of laser processing of inorganic workpiece (thirteenth aspect of the invention), it is necessary to select and use a protective sheet having a base material of which total coupling energy A is less than 800 kJ/mol. Values of total coupling energies A and B are obtained from the coupling energy values mentioned, for example, in the publication (Cox, J. D. and Pilcher, G., Thermochemistry of organic and organometallic compounds, Academic Press, New York, 1970).

Forming materials of base material include, for example, polyethylene terephthalate, polyethylene naphthalate, polystyrene, polycarbonate, polyimide, (meth)acrylic polymer, polyurethane, silicone rubber, polyethylene, polypropylene, polyethylene oxide, and other polyolefin polymers, and are not limited to these examples alone. These materials may be used either alone or in combination of two or more types. Above all, it is preferred to use an aromatic polymer, and particularly it is preferred to use polyimide, polyethylene naphthalate, or polycarbonate.

In the third and fourth aspects of the invention, it is preferred to use a material of high extinction coefficient, such as polyimide, polyethylene naphthalate, polystyrene, polycarbonate, other aromatic polymers, and silicone rubber.

In the fifth and sixth aspects of the invention, it is preferred to use a material of relatively high density, such as polyethylene naphthalate, polyurethane, polyimide, and silicone rubber.

In the seventh and eighth aspects of the invention, in order to enhance the tensile strength of base material, it is preferred to use aromatic polymer and silicone rubber, and in particular it is preferred to use polyimide, polyethylene naphthalate, polystyrene, or polycarbonate.

In the ninth aspect of the invention, it is preferred to use a material of relatively small specific heat, such as polyethylene terephthalate, polyethylene naphthalate, polystyrene, polyurethane, and polycarbonate.

In the tenth and eleventh aspects of the invention, it is preferred to use a material of high refractive index at wavelength 546 nm, such as polyimide, polyethylene naphthalate, polystyrene, polycarbonate, other aromatic polymers, and silicone rubber.

In the twelfth and thirteen aspects of the invention, in order to lower the value of total coupling energy A, it is preferred to use aromatic polymer, and in particular it is preferred to use polyimide, polyethylene terephthalate, polyethylene naphthalate, polystyrene, or polycarbonate.

Preferably, a filler should be added to the base material. The filler is a material added for keeping the light transmissivity in laser beam absorption region at less than 50% (first aspect of the invention), keeping the etching rate at 0.4 or more (second aspect of the invention), heightening the extinction coefficient of base material (third and fourth aspects of the invention), heightening the tensile strength of base material (seventh and eighth aspects of the invention), or heightening the refractive index of base material (tenth and eleventh aspects of the invention), and its examples include pigment, dyestuff, coloring matter, Au, Cu, Pt, Ag and other fine metal particles, metal colloid, carbon and other inorganic fine particles.

The coloring matter is not particularly specified as far as it can absorb the light of specific wavelength of the user being used (light of ultraviolet region wavelength λ), and the dyestuff includes various types such as basic dye, acid dye, and direct dye. Examples of dyestuff and coloring matter include nitro dye, nitroso dye, stilbene dye, pyrazolone dye, thiazole dye, azo dye, polyazo dye, carbonium dye, quinoanyl dye, indophenol dye, indoaniline dye, indamine dye, quinonimine dye, azine dye, oxidizing dye, oxazine dye, thiazine dye, acryzine dye, diphenyl methane dye, triphenyl methane dye, xanthene dye, thioxanthene dye, sulfurizing dye, pyridine dye, pyridone dye, thiadiazole dye, thiophene dye, benzoin thiazole dye, quinoline dye, indigo dye, thioindigo dye, anthraquinone dye, benzophenone dye, benzoquinone dye, naphthoquinone dye, phthalocyanine dye, cyanine dye, methine dye, polymethine dye, azomethine dye, condensed methine dye, naphthal imide dye, perinone dye, triaryl methane dye, xanthene dye, aminoketone dye, oxyketone dye, and indigoid dye. These dyes may be used either alone or in combination of two or more types.

The dyestuff or coloring matter may be nonlinear optical coloring matter. The nonlinear optical coloring matter is not particularly specified, and known nonlinear optical coloring matters may be used (for example, benzene nonlinear optical coloring matter, stilbene nonlinear optical coloring matter, cyanine nonlinear optical coloring matter, azo nonlinear optical coloring matter, rhodamine nonlinear optical coloring matter, biphenyl nonlinear optical coloring matter, chalcone nonlinear optical coloring matter, and cyanocinnamic acid nonlinear optical coloring matter).

Further, as the dyestuff or coloring matter, so-called "functional coloring matter" may be also used. The functional coloring matter is composed of carrier forming material and carrier moving material. The carrier forming material is, for example, perylene pigment, quinone pigment, squalilium coloring matter, azulenium coloring matter, thiapyrilium coloring matter, and bisazo pigment. The carrier moving material includes oxadiazole derivative, oxazole derivative, pyrazoline derivative, hydrozine derivative, aryl amine derivative, etc.

The content of the filler may be properly adjusted depending on the light transmissivity of the base polymer used (first aspect of the invention), the etching rate of the base polymer (second aspect of the invention), the extinction coefficient of base polymer and extinction coefficient of workpiece (third and fourth aspects of the invention), the relation of tensile strength of base polymer and tensile strength of workpiece (seventh and eighth aspects of the invention), or the refractive index of base polymer or refractive index of workpiece (tenth and eleventh aspects of the invention), but usually it is preferred to be about 2 to 20 parts by weight in 100 parts by weight of base polymer, and more preferably about 2 to 10 parts by weight.

The base material may be made of a single layer or plural layers. It may be formed as membrane, mesh or other shape.

The thickness of base material may be properly adjusted within a range not spoiling the handling and working efficiency at each step of adhering to the workpiece, cutting or drilling of workpiece, and peeling and collecting of cut pieces, but usually it is about 500 µm or less, or preferably about 3 to 300 µm, or more preferably 5 to 250 µm. The surface of base material is treated by ordinary surface treatment for enhancing the contact with the adjacent material or retaining property, such as chromate treatment, ozone exposure, flame exposure, high voltage electric impact exposure, ionization radiation treatment, and other chemical or physical treatment.

Forming materials of adhesive layer include known adhesive materials including (meth)acrylic polymer and rubber polymer.

Monomer components for forming (meth)acrylic polymer are alkyl (meth)acrylates having alkyl radical of straight chain or branch chain with 30 carbon atoms or less, or preferably 4 to 18 carbon atoms, including, for example, methyl radical, ethyl radical, n-propyl radical, isopropyl radical, n-butyl radical, t-butyl radical, isobutyl radical, amyl radical, isoamyl radical, hexyl radical, heptyl radical, cyclohexyl radical, 2-ethyl hexyl radical, octyl radical, iso-octyl radical, nonyl radical, isononyl radical, decynol radical, isodecyl radical, undecyl radical, lauryl radical, tridecyl radical, tetradecyl radical, stearyl radical, octadecyl radical, and dodecyl radical. These alkyl (meth)acrylates may be used either alone or in combination of two or more types.

In order to modify the adhesiveness, coagulation or heat resistance of (meth)acrylic polymer, other monomer components than mentioned above may be copolymerized as required.

Other monomers capable of forming such polymers include, for example, acrylic acid and methacrylic acid, carboxyethyl(meth)acrylate and carboxypentyl(meth)acrylate, itaconic acid and maleic acid, fumaric acid and crotonic acid or other monomer containing carboxyl radical, maleic anhydride and itaconic anhydride or other monomer of acid anhydride, (meth)acrylic acid 2-hydroxyl ethyl and (meth)acrylic acid 2-hydroxyl propyl, (meth)acrylic acid 4-hydroxyl butyl and (meth)acrylic acid 6-hydroxylhexyl, (meth)acrylic acid 8-hydroxyoctyl and (meth)acrylic acid 10-hydroxyl decyl, (meth)acrylic acid 12-hydroxylauryl and (4-hydroxymethyl cyclohexyl)-methylacrylate or other monomer containing hydroxyl radical, styrene sulfonic acid and acrylic sulfonic acid, 2-(meth)acrylic amide-2-methyl propane sulfonic acid and (meth)acrylic amide propane sulfonic acid, sulfopropyl (meth)acrylate and (meth)acryloyl oxynaphthalene sulfonic acid or other monomer containing sulfonic acid radical, 2-hydroxy ethyl acryloyl phosphate or other monomer containing phosphoric acid radical, (meth)acrylic amide, (meth)acrylic acid N-hydroxymethyl amide, (meth)acrylic acid alkyl aminoalkyl ester (for example, dimethyl aminoethyl methacrylate), t-butyl aminoethyl methacrylate, etc.), N-vinyl pyrrolidone, acryloyl morphorine, vinyl acetate, styrene, acrylonitrile, etc.

In addition, for the purpose of crosslinking of acrylic polymer or the like, multifunctional monomers and the like may be added as required as monomer component for copolymerization. Examples of such monomer include hexane diol di(meth)acrylate and (poly)ethylene glycol di(meth)acrylate, (poly)propylene glycol di(meth)acrylate and neopentyl glycol di(meth)acrylate, pentaerythritol di(meth)acrylate and trimethylol propane tri(meth)acrylate, pentaerythritol hexatri (meth)acrylate and dipentaerythritol hexa(meth)acrylate, epoxy acrylate and polyester acrylate, urethane acrylate, and others. One type or two or more types of multifunctional monomer may be used.

The content of multifunctional monomer is preferred to be 30 wt % or less of the total monomer content from the viewpoint of adhesiveness and others, and more preferably 20 wt % or less.

To prepare (meth)acrylic polymer, various methods may be applied, for example, solution polymerization method of mixture containing one, two or more types of monomer components, emulsification polymerization method, block polymerization, and suspension polymerization method.

Polymerization initiator includes peroxides such as hydrogen peroxide, benzoyl peroxide, and t-butyl peroxide. It is preferred to use alone, but it may be combined with reducer to be used as redox polymerization initiator. The reducer includes sulfite, hydrogen sulfite, iron, copper, cobalt salt, or other ionized salt, triethanolamine and other amines, aldose, ketose, and other reducing sugar. An azo compound is also a preferred polymerization initiator, and its example includes 2,2'-azobis-2-methylpropio amidinate, 2,2'-azobis-2,4-dimethyl valeronitrile, 2,2'-azobis-N,N'-dimethylene isobutyl amidinate, 2,2'-azobis isobutyronitrile, and 2,2'-azobis-2-methyl-N-(2-hydroxy ethyl) propione amide. Two or more types of these polymerization initiators may be used in combination.

Reaction temperature is usually about 50 to 85° C., and the reaction time is about 1 to 8 hours. Among the manufacturing method, solution polymerization is preferred, and as solvent of (meth)acrylic polymer, generally, ethyl acetate, toluene, and other polar solvents are used. The solution concentration is generally about 20 to 80 wt %.

The adhesive agent may be properly combined with a crosslinking agent for raising the number-average molecular weight of (meth)acrylic polymer used as base polymer. Examples of crosslinking agent include polyisocyanate compound, epoxy compound, aziridine compound, melamione resin, urea resin, anhydrous compound, polyamine, and polymer containing carboxyl radical. When the crosslinking agent is used, its content must be determined so that the peel adhesive strength may not be lowered too much, and generally it is preferred to add by about 0.01 to 5 parts by weight in 100 parts by weight of base polymer. The adhesive agent for forming the adhesive layer may be also combined with other known additives as required, in addition to the specified components, such as adhesion improver, aging retardant, filler, coloring matter, and others.

To improve peeling from workpiece, the adhesive agent is preferred to be radiation curing type adhesive which is cured by radiation such as ultraviolet ray or electron ray. When a radiation curing type adhesive is used as the adhesive agent, since the adhesive layer is irradiated with radiation after laser processing, the base material is preferred to have a sufficient radiation transmissivity.

The radiation curing type adhesive includes, for example, radiation curing type adhesive prepared by blending radiation curing monomer component or oligomer component to the (meth)acrylic polymer.

Examples of monomer component or oligomer component of radiation curing type to be blended include urethane; (meth)acrylate oligomer, trimethylol propane tri(meth)acrylate, tetramethylol methane tetra(meth)acrylate, tetraethylene glycol di(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butylene glycol di(meth)acrylate, 1,6-hexane diol (meth)acrylate, and other ester compounds of (meth)acrylate and polyhydric alcohol; 2-propenyl-3-butenyl cyanurate, tris(2-methacryloxy ethyl) isocyanurate, and other isocyanurate or isocyanurate compounds. One type or two or more types of monomer component or oligomer component may be used.

The blending amount of radiation curing monomer component or oligomer component is not particularly specified, but considering the adhesiveness, it is preferred to add by about 5 to 500 parts by weight in 100 parts by weight of base polymer such as (meth)acrylic polymer for composing the adhesive agent, and more preferably by about 70 to 150 parts by weight.

As the radiation curing type adhesive, further, a base polymer having carbon-carbon double bond in the polymer side chain, main chain or main chain end may be used. Such base polymer is preferred to have (meth)acrylic polymer as basic skeleton. In this case, radiation curing type monomer component or oligomer component may not be added, and its use is free.

The radiation curing type adhesive should contain a photopolymerization initiator when curing by ultraviolet ray or the like.

Examples of photopolymerization initiator include 4-(2-hydroxy ethoxy) phenyl (2-hydroxy-2-propyl) ketone, alpha-hydroxy-alpha, alpha-methyl acetophenone, methoxy acetophenone, 2,2-dimethoxy-2-saphenyl acetophenone, 2,2-diethoxy acetophenone, 1-hydroxy siurohexyl phenyl ketone, 2-methyl-1-(4-(methylthio)-phenylco-2-morpholinopropane-1, other acetophenone compounds, benzoin ethyl ether, benzoin isopropylether, anizoin methyl ether, other benzoin ether compounds, 2-methyl-2-hydroxypropiophenone, other alpha-ketol compounds, benzyl dimethyl ketal, other ketal compounds, 2-naphthalene sulfonyl chloride, other aromatic sulfonyl chloride compounds, 1-phenone-1,1-propane dione-2-(O-ethoxy carbonyl) oxime, other photoactive oxime compounds, benzophenone and benzoyl benzoic acid, 3,3'-dimethyl-4-methoxybenzophenone, other benzophenone compounds, thioxanthone, 2-chlorothioxanthone, 2-methl thioxanthone, 2,4-dimethyl thioxanthone, isopropyl thioxanthone, 2,4-dichlorothoixanthone, 2,4-diethyl thioxanthone, 2,4-diisopropyl thioxanthone, other thioxanthone compounds, and also campher quinone, ketone halide, acyl phosphino oxide, acyl phosphoanate, etc.

The content of photopolymerization initiator is preferred to be about 0.1 to 10 parts by weight in 100 parts by weight of base polymer such as (meth)acrylic polymer for composing the adhesive agent, or more preferably about 0.5 to 5 parts by weight.

The protective sheet can be manufactured by applying an adhesive solution on the surface of a base material, and drying (or heating and crosslinking as required) to form an adhesive layer. Alternatively, an adhesive layer may be separately formed on a peeling liner, and it may be adhered to the base material. The adhesive layer may one layer or two or more layers. As required, a separator may be formed on the surface of the adhesive layer.

The adhesive layer is preferred to be low in content of low molecular substance from the viewpoint of prevention of contamination on workpiece. From such point of view, the number-average molecular weight of (meth)acrylic polymer is preferred to be 300,000 or more, more preferably 400,000 to 3,000,000, and further preferably 800,000 to 3,000,000.

The thickness of adhesive layer may be properly selected within a range not peeling from the workpiece, and is preferred to be about 5 to 300 μm, more preferably about 10 to 100 μm, and further preferably about 10 to 50 μm.

The adhesive strength of adhesive layer is preferred to be 20 N/20 mm or less on the basis of adhesive strength (90-degree peel value, peeling speed 300 mm/min) at ordinary temperature (before laser emission) on SUS304, and more preferably 0.001 to 10 N/20 mm, or further preferably 0.01 to 8 N/20 mm.

The separator is used as required for protecting label processing or adhesive layer. The material for the separator includes paper, polyethylene, polypropylene, polyethylene terephthalate, and other synthetic resin film. The surface of the separator may be properly treated for improving the peeling performance from the adhesive layer by, for example, silicone treatment, long-chain alkyl treatment, fluorine treatment or other peeling treatment. As required, further, ultraviolet transmission preventive treatment may be applied to prevent the protective sheet from reacting by environmental ultraviolet rays. The thickness of the separator is usually 10 to 200 μm, preferably about 25 to 100 μm.

The following is the explanation of manufacturing method of laser processed parts by ultraviolet absorption ablation of laser beam using the protective sheet of the invention. For example, in the case of cutting process, as shown in FIG. 1 and FIG. 3, a protective sheet 2, a workpiece (or metal workpiece) 1, and an adhesive sheet 3 are glued together by known means such as roll laminator and press to obtain a laminated body 4 of protective sheet, workpiece and adhesive sheet, which is disposed on an adsorption plate 6 of an adsorption stage 5, and a laser beam 7 is emitted to the laminated body 4 from a specified laser oscillator by focusing and emitting on the protective sheet 2 by means of a lens, and the laser emission position is moved along the specified processing line to cut the workpiece. The adhesive sheet 3 disposed at the exit side of laser beam of the workpiece plays the role of supporting and fixing the workpiece before laser processing, and plays the role of preventing the cut piece from falling after laser processing, and a sheet of low laser processability is used. As the adhesive sheet 3, a general material having an adhesive layer laminated on a base material may be used without particular limitation.

Laser beam moving means includes galvano scan, X-Y stage scan, mask image processing, and other known laser processing method.

The laser processing condition is not particularly specified as far as the protective sheet 2 and workpiece 1 can be cut off completely, but in order to prevent cutting of adhesive sheet 3, it is preferred to control within 2 times of energy condition for cutting the workpiece 1.

The cutting allowance (section groove) can be narrowed by reducing the beam diameter of focusing unit of laser beam, but in order to enhance the section end precision, it is preferred to satisfy the condition of beam diameter (μm)>2× (laser beam moving speed (μm/sec)/laser beam repetition frequency (Hz)).

In the case of drilling, as shown in FIG. 2, a protective sheet 2, a workpiece 1, and an adhesive sheet 3 are glued together by known means such as roll laminator and press to obtain a laminated body 4 of protective sheet, workpiece and adhesive sheet, which is disposed on an adsorption plate 6 of an adsorption stage 5, and a laser beam 7 is emitted to the laminated body 4 from a specified laser oscillator by focusing and emitting on the protective sheet 2 by means of a lens, and a hole is formed.

The hole is formed by known laser processing method such as punching by galvano scan, X-Y stage scan, mask imaging. The laser processing condition may be determined at the optimum value on the basis of the ablation threshold of workpiece. To prevent drilling of adhesive sheet 3, it is preferred to control within 2 times of energy condition for drilling the workpiece 1.

Decomposition products can be scattered and removed efficiently by blowing gas of helium, nitrogen or oxygen to the laser processing unit.

In cutting process of semiconductor wafer, as shown in FIG. 4, one side of a semiconductor wafer 8 is adhered to an adhesive sheet 3 disposed on an adsorption stage 5, a protective sheet 2 is disposed at other side, and a laser beam 7 generated from a specified laser oscillator is focused and emitted to the protective sheet 2 by a lens, and the laser emission position is moved along the specified processing line, so that it is cut off. Laser beam moving means includes galvano scan, X-Y stage scan, mask image processing, and other known laser processing method. The laser processing condition is not particularly specified as far as the protective sheet 2 and semiconductor wafer 8 can be cut off completely, while the adhesive sheet 3 is not cut off.

In such cutting process of semiconductor wafer, after cutting into individual semiconductor chips, the individual semiconductor chips can be picked up and collected by known methods such as the method of picking up by using a poking pin called needle by a conventional die bonder or other device, or a method disclosed in Japanese Laid-open Patent No. 2001-118862.

In the manufacturing method of laser processed parts of the invention, after laser processing, the protective sheet 2 is peeled off from the laser processed part 10. The peeling method is not particularly specified, but it is important not to apply stress to cause permanent set of laser processed part 10 at the time of peeling. For example, when radiation curing type adhesive is used in the adhesive layer, the adhesiveness is lowered by curing the adhesive layer by radiation irradiation depending on the type of adhesive agent. By irradiation with radiation, the adhesiveness of the adhesive layer is lowered by curing, and it is easier to peel off. Irradiation means of radiation is not particularly specified, and, for example, ultraviolet radiation may be used.

In the manufacturing method of laser processed parts of the first aspect of the invention, by using the protective sheet, decomposition products generated from the laser beam exposed part stick to the surface of the protective sheet which covers the workpiece, sticking of decomposition products to the surface of the workpiece can be effectively prevented. Besides, when using the protective sheet large in the laser energy utilization efficiency of less than 50% of light transmissivity in the laser beam absorption region, the protective sheet is eroded by the laser beam earlier than the workpiece, and after the laser beam exposed part of the protective sheet is eroded, the workpiece in the lower layer is eroded. Accordingly, the decomposition products of the workpiece scatter outside from the eroded portion of the protective sheet, and contamination at the interface of the protective sheet and workpiece can be suppressed.

In the manufacturing method of laser processed parts of the second aspect of the invention, by using the protective sheet of which etching rate of base material is 0.4 or more, the protective sheet is likely to be etched by the laser beam earlier than the workpiece, and after the laser beam exposed part of the protective sheet is sufficiently etched, the workpiece in the lower layer is etched. Accordingly, the decomposition products of the workpiece scatter outside efficiently from the etching portion of the protective sheet, and contamination at the interface of the protective sheet and workpiece can be suppressed.

In the manufacturing method of laser processed parts of the third (or fourth) aspect of the invention, by using the protective sheet of which extinction coefficient ratio is 1 or more (or protective sheet having a base material of which extinction coefficient at ultraviolet region wavelength λ is 20 $cm^{-1}$ or more), the protective sheet is more likely to be etched than the workpiece (or metal material), and after the laser beam exposed part of the protective sheet is sufficiently etched, the workpiece in the lower layer is etched. Accordingly, the decomposition products of the workpiece scatter outside efficiently from the etching portion of the protective sheet, and contamination at the interface of the protective sheet and workpiece can be suppressed.

In the manufacturing method of laser processed parts of the fifth aspect of the invention, by using the protective sheet of which density ratio is 1 or more, the protective sheet is more likely to be etched than the workpiece, and after the laser beam exposed part of the protective sheet is sufficiently etched, the workpiece in the lower layer is etched. In the manufacturing method of laser processed parts of the sixth aspect of the invention, by using the protective sheet having a base material of which density is 1.1 g/cm³ or more, the protective sheet is more likely to be etched than the metal material, and after the laser beam exposed part of the protective sheet is sufficiently etched, the metal material in the lower layer is etched. Accordingly, the decomposition products of the workpiece (metal material) scatter outside efficiently from the etching portion of the protective sheet, and contamination at the interface of the protective sheet and workpiece (metal material) can be suppressed.

In the manufacturing method of laser processed parts of the seventh (or eighth) aspect of the invention, by using the protective sheet of which tensile strength ratio is 1 or more (or protective sheet of which tensile strength is 100 MPa or more), the protective sheet is more likely to be etched than the workpiece (or metal material), and after the laser beam exposed part of the protective sheet is sufficiently etched, the workpiece in the lower layer is etched. Accordingly, the decomposition products of the workpiece scatter outside efficiently from the etching portion of the protective sheet, and contamination at the interface of the protective sheet and workpiece can be suppressed.

In the manufacturing method of laser processed parts of the ninth aspect of the invention, by using the protective sheet of which density specific heat ratio is less than 1, the protective sheet is more likely to be etched than the workpiece, and after the laser beam exposed part of the protective sheet is sufficiently etched, the workpiece in the lower layer is etched. Accordingly, the decomposition products of the workpiece scatter outside efficiently from the etching portion of the protective sheet, and contamination at the interface of the protective sheet and workpiece can be suppressed.

In the manufacturing method of laser processed parts of the tenth (or eleventh) aspect of the invention, by using the protective sheet of which refractive index ratio is 1 or more (or protective sheet having a base material of which refractive index at wavelength 546 nm is 1.53 or more), the protective sheet is more likely to be etched than the workpiece, and after the laser beam exposed part of the protective sheet is sufficiently etched, the workpiece in the lower layer is etched. Accordingly, the decomposition products of the workpiece scatter outside efficiently from the etching portion of the protective sheet, and contamination at the interface of the protective sheet and workpiece can be suppressed.

In the manufacturing method of laser processed parts of the twelfth (or thirteenth) aspect of the invention, by using the protective sheet of which total coupling energy ratio is less than 1 (or protective sheet having a base material of which total coupling energy A is less than 800 kJ/mol), the protective sheet is more likely to be etched than the workpiece, and after the laser beam exposed part of the protective sheet is sufficiently etched, the workpiece in the lower layer is etched. Accordingly, the decomposition products of the workpiece scatter outside efficiently from the etching portion of the protective sheet, and contamination at the interface of the protective sheet and workpiece can be suppressed.

Therefore, according to the manufacturing methods of the invention, decomposition products do not stick to the interface of the protective sheet and workpiece (laser processed part), and after laser processing of workpiece, the protective sheet can be easily peeled off from the laser processed parts, and the laser processing precision of workpiece can be also enhanced.

EXAMPLES

Exemplary embodiments of the invention are described specifically below, but it must be noted that the invention is not limited by these embodiments alone.

(First Aspect of the Invention)

[Measurement of Number-Average Molecular Weight]

Number-average molecular weight of synthesized (meth) acrylic polymer was measured in the following method. By dissolving the synthesized (meth)acrylic polymer in THF at 0.1 wt %, the number-average molecular weight was calculated by polystyrene conversion by using GPC (gel permeation chromatography). The measuring condition is as follows.

GPC apparatus: HLC-8210GPC of Tosoh corporation
Column: (GMHHR-H)+(GMHHR-H)+(G2000HHR) of Tosoh corporation
Flow rate: 0.8 ml/min
Concentration: 0.1 wt %
Injection: 100 μl
Column temperature: 40° C.
Eluate: THF

[Measurement of Light Transmissivity]

Cutting base material and protective sheet into proper size, the light transmissivity was measured at wavelength 355 nm by using measuring apparatus U-3400 (Hitachi, Ltd.). The protective sheet was measured from the adhesive layer side.

Example 1

On a base material (thickness: 20 μm, light transmissivity at wavelength 355 nm: 0%) made of polyethylene naphthalate (weight ratio of aromatic ring in repetition unit: 64 wt %), ultraviolet curable acrylic adhesive solution (1) was applied, and dried to form an adhesive layer (thickness 10 μm), and a protective sheet was obtained. The light transmissivity of this protective sheet at wavelength 355 nm was 0%.

The acrylic adhesive solution (1) was prepared as follows. In 100 parts by weight of acrylic polymer of number-average molecular weight of 800,000 obtained by copolymerization of butyl acrylate, ethyl acrylate, 2-hydroxy ethyl acrylate, and acrylic acid at ratio by weight of 60/40/4/1, 90 parts by weight of dipenta erythritol monohydroxy penta acrylate as photopolymerizable compound, and 5 parts by weight of benzyl dimethyl ketal (Irgacure 651) as photopolymerization initiator were added together with 650 parts by weight of toluene, and the mixture was uniformly dissolved and stirred, and the acrylic adhesive solution (1) was prepared.

On one side of silicon wafer of 100 μm in thickness, the manufactured protective sheet was adhered by a roll laminator, and a silicon wafer with protective sheet was fabricated. On an XY stage mounting an adsorption plate of glass epoxy resin, the silicon wafer with protective sheet was placed with the protective sheet upside. Using YAG laser of wavelength 355 nm, average output 5 W and repetition frequency 30 kHz, third harmonic wave (355 nm) was focused on the surface of silicon wafer with protective sheet in a diameter of 25 μm by fθ lens, and the surface was scanned by laser beam at a speed of 20 mm/sec by galvano scanner, and was cut off. At this time, cutting of protective sheet and silicon wafer was confirmed. After peeling off the protective sheet, the protective sheet gluing surface of the silicon wafer (the laser beam incident side) was observed particularly in the laser processing area, and decomposition products (deposits) were not observed.

Comparative Example 1

The silicon wafer was processed by laser in the same manner as in Example 1, except that protective sheet was not glued to one side of the silicon wafer. When the surface of the laser beam incident side of the silicon wafer was observed, sticking of much residue of scattering decomposition products was recognized.

Reference Example 1

The silicon wafer was processed by laser in the same manner as in Example 1, except that polyvinyl alcohol sheet (thickness: 50 μm, light transmissivity at wavelength 355 nm: 84.4%) was used as base material of protective sheet. As a result, the protective sheet was not cut off sufficiently, and the silicon wafer in the lower layer was processed by laser, and foams including decomposition product residue were generated between the protective sheet and silicon wafer. By peeling off the protective sheet, the opening area of the laser beam incident side of the silicon wafer was observed, and sticking of residue of scattering decomposition products of silicon wafer was recognized.

Example 2

On a base material (thickness: 13 μm, light transmissivity at wavelength 355 nm: 0%) made of polyimide (weight ratio of aromatic ring in repetition unit: 64 wt %), ultraviolet curable acrylic adhesive solution (2) was applied, and dried to form an adhesive layer (thickness 10 μm), and a protective sheet was obtained. The light transmissivity of this protective sheet at wavelength 355 nm was 0%.

The acrylic adhesive solution (2) was prepared as follows. In 100 parts by weight of acrylic polymer of number-average molecular weight of 500,000 obtained by copolymerization of butyl acrylate, ethyl acrylate, and 2-hydroxy ethyl acrylate at ratio by weight of 50/50/16, 20 parts by weight of 2-methacryloyl oxyethyl isocyanate was added to react, and a carbon-carbon double bond was introduced into the side chain in the polymer molecule (at this time, the side chain is 13 atoms long). In 100 parts by weight of this polymer, 1 part by weight of polyisocyanate crosslinking agent (Coronate L) and 3 parts by weight of alpha-hydroxy ketone (Irgacure 184) as photopolymerization initiator were added together with 350 parts by weight of toluene, and the mixture was uniformly dissolved and stirred, and the acrylic adhesive solution (2) was prepared.

On a two-layer substrate forming a copper layer of 18 μm in thickness on a polyimide film of 25 μm in thickness, a circuit was formed by exposing, developing, and etching process, and a flexible printed board was manufactured. The manufactured flexible printed board and protective film were glued together by a roll laminator, and a flexible printed board with protective sheet was manufactured.

On an XY stage mounting a ceramic adsorption plate of alumina, the flexible printed board with protective sheet was placed with the protective sheet upside. Using YAG laser of wavelength 355 nm, average output 5 W and repetition frequency 30 kHz, third harmonic wave (355 nm) was focused on the surface of flexible printed board with protective sheet in a diameter of 25 μm by fθ lens, and the surface was scanned by laser beam at a speed of 20 mm/sec by galvano scanner, and was cut off. At this time, cutting of protective sheet and flexible printed board was confirmed. After peeling off the protective sheet, the protective sheet gluing surface of the flexible printed board (the laser beam incident side) was observed particularly in the laser processing area, and decomposition products (deposits) were not observed.

Example 3

The flexible printed board was processed by laser in the same manner as in Example 2, except that polyethylene terephthalate film (ratio by weight of aromatic ring in repetition unit: 41 wt %, thickness: 50 μm, light transmissivity at wavelength 355 nm: 44.9%) was used as base material of protective sheet. As a result, cutting of protective sheet and flexible printed board was confirmed. After peeling off the protective sheet, the protective sheet gluing surface of the flexible printed board (the laser beam incident side) was observed particularly in the laser processing area, and decomposition products (deposits) were not observed.

Example 4

The flexible printed board was processed by laser in the same manner as in Example 2, except that polycarbonate film (ratio by weight of aromatic ring in repetition unit: 61 wt %, thickness: 20 μm, light transmissivity at wavelength 355 nm: 0%) was used as base material of protective sheet. As a result, cutting of protective sheet and flexible printed board was confirmed. After peeling off the protective sheet, the protective sheet gluing surface of the flexible printed board (the laser beam incident side) was observed particularly in the laser processing area, and decomposition products (deposits) were not observed.

Example 5

A base material for protective sheet was manufactured by forming a sheet by casting a polymer obtained by copolymerization of 4-methyl-1-pentyne and 1,4-bis{2-[4-N,N-di(p-tolyl) amino) phenyl]vinyl} benzine at ratio by weight of 97/3.

The flexible printed board was processed by laser in the same manner as in Example 2, except that the above manufactured base material (ratio by weight of aromatic ring in repetition unit: 2.4 wt %, thickness: 10 μm, light transmissivity at wavelength 355 nm: 5%) was used as base material of protective sheet. As a result, cutting of protective sheet and flexible printed board was confirmed. After peeling off the protective sheet, the protective sheet gluing surface of the flexible printed board (the laser beam incident side) was observed particularly in the laser processing area, and decomposition products (deposits) were not observed.

(Second Aspect of the Invention)

[Measurement of Number-Average Molecular Weight]

Measured in the same manner as in the first aspect of the invention.

[Measurement of Etching Rate]

Using YAG laser shaped into tophat beam (maximum output 5 W, repetition frequency 30 kHz), third harmonic wave (355 μm) was focused by fθ lens, and emitted to the base material surface in the condition of pulse number 50 (pulses). After exposure, the depth (μm) of groove formed in the base material was measured by optical microscope. The etching speed is calculated in the following formula.

Etching speed=groove depth(μm)/pulse number (pulses).

The energy fluence of YAG laser was 5 (J/cm$^2$). The etching rate is calculated in the following formula form the etching speed and energy fluence. Etching rate=etching speed (μm/pulse)/energy fluence (J/cm$^2$).

Example 1

On a base material made of polystyrene (thickness: 20 μm, etching rate: 0.48), ultraviolet curable acrylic adhesive solution (1) was applied, and dried to form an adhesive layer (thickness 10 μm), and a protective sheet was obtained.

The acrylic adhesive solution (1) was prepared as follows. In 100 parts by weight of acrylic polymer of number-average molecular weight of 800,000 obtained by copolymerization of butyl acrylate, ethyl acrylate, 2-hydroxy ethyl acrylate, and acrylic acid at ratio by weight of 60/40/4/1, 90 parts by weight of dipenta erythritol monohydroxy penta acrylate as photopolymerizable compound, and 5 parts by weight of benzyl dimethyl ketal (Irgacure 651) as photopolymerization initiator were added together with 650 parts by weight of toluene, and the mixture was uniformly dissolved and stirred, and the acrylic adhesive solution (1) was prepared.

On one side of silicon wafer of 100 μm in thickness, the manufactured protective sheet was adhered by a roll laminator, and a silicon wafer with protective sheet was fabricated. On an XY stage mounting an adsorption plate of glass epoxy resin, the silicon wafer with protective sheet was placed with the protective sheet upside. Using YAG laser of wavelength 355 nm, average output 5 W and repetition frequency 30 kHz, third harmonic wave (355 nm) was focused on the surface of silicon wafer with protective sheet in a diameter of 25 μm by fθ lens, and the surface was scanned by laser beam at a speed of 20 mm/sec by galvano scanner, and was cut off. At this time, cutting of protective sheet and silicon wafer was confirmed. After peeling off the protective sheet, the protective sheet gluing surface of the silicon wafer (the laser beam incident side) was observed particularly in the laser processing area, and decomposition products (deposits) were not observed.

Comparative Example 1

The silicon wafer was processed by laser in the same manner as in Example 1, except that protective sheet was not glued to one side of the silicon wafer. When the processing area of the laser beam incident side of the silicon wafer was observed, sticking of much residue of scattering decomposition products was recognized.

Comparative Example 2

The silicon wafer was processed by laser in the same manner as in Example 1, except that polyethylene sheet (thickness: 50 μm, etching rate: 0) was used as base material of protective sheet. As a result, the protective sheet was not cut off, and the silicon wafer in the lower layer was processed by laser, and foams including decomposition product residue were generated between the protective sheet and silicon wafer. By peeling off the protective sheet, the opening area of the laser beam incident side of the silicon wafer was observed, and sticking of much residue of decomposition products of silicon wafer was recognized.

Comparative Example 3

The silicon wafer was processed by laser in the same manner as in Example 1, except that polyurethane sheet (thickness: 50 μm, etching rate: 0.26) was used as base material of protective sheet. As a result, the protective sheet was not cut off, and the silicon wafer in the lower layer was processed by laser, and foams including decomposition product residue were generated between the protective sheet and silicon wafer. By peeling off the protective sheet, the opening area of the laser beam incident side of the silicon wafer was observed, and sticking of much residue of decomposition products of silicon wafer was recognized.

Example 2

On a base material of silicone rubber (thickness: 20 μm, etching rate: 0.52), ultraviolet curable acrylic adhesive solution (2) was applied, and dried to form an adhesive layer (thickness 10 μm), and a protective sheet was obtained.

The acrylic adhesive solution (2) was prepared as follows. In 100 parts by weight of acrylic polymer of number-average molecular weight of 500,000 obtained by copolymerization of butyl acrylate, ethyl acrylate, and 2-hydroxy ethyl acrylate at ratio by weight of 50/50/16, 20 parts by weight of 2-methacryloyl oxyethyl isocyanate was added to react, and a carbon-carbon double bond was introduced into the side chain in the polymer molecule (at this time, the side chain is 13 atoms long). In 100 parts by weight of this polymer, 1 part by weight of polyisocyanate crosslinking agent (Coronate L) and 3 parts by weight of alpha-hydroxy ketone (Irgacure 184) as photopolymerization initiator were added together with 400 parts by weight of toluene, and the mixture was uniformly dissolved and stirred, and the acrylic adhesive solution (2) was prepared.

On a two-layer substrate forming a copper layer of 18 μm in thickness on a polyimide film of 25 μm in thickness, a circuit was formed by exposing, developing, and etching process, and a flexible printed board was manufactured. The manufactured flexible printed board and protective film were glued together by a roll laminator, and a flexible printed board with protective sheet was manufactured.

On an XY stage mounting a ceramic adsorption plate of alumina, the flexible printed board with protective sheet was placed with the protective sheet upside. Using YAG laser of wavelength 355 nm, average output 5 W and repetition frequency 30 kHz, third harmonic wave (355 nm) was focused on the surface of flexible printed board with protective sheet in a diameter of 25 μm by fθ lens, and the surface was scanned by laser beam at a speed of 20 mm/sec by galvano scanner, and was cut off. At this time, cutting of protective sheet and flexible printed board was confirmed. After peeling off the protective sheet, the protective sheet gluing surface of the flexible printed board (the laser beam incident side) was observed particularly in the laser processing area, and decomposition products (deposits) were not observed.

Example 3

The flexible printed board was processed by laser in the same manner as in Example 2, except that polyimide film (thickness: 13 μm, etching rate: 0.95) was used as base material of protective sheet. As a result, cutting of protective sheet and flexible printed board was confirmed. After peeling off the protective sheet, the protective sheet gluing surface of the flexible printed board (the laser beam incident side) was observed particularly in the laser processing area, and decomposition products (deposits) were not observed.

Example 4

A polypropylene sheet of 20 μm in thickness was manufactured by mixing 99 parts by weight of polypropylene and 1 part by weight of carbon black, and fusing and extruding.

The silicon wafer was processed by laser in the same manner as in Example 2, except that the above manufactured polypropylene (etching rate: 0.45) was used as base material of protective sheet. After peeling off the protective sheet, the protective sheet gluing surface of the flexible printed board (the laser beam incident side) was observed particularly in the laser processing area, and decomposition products (deposits) were not observed.

As clear from the examples and comparisons, by using the protective sheet having a base material of which etching rate is 0.4 or more, contamination of surface of workpiece by decomposition products can be effectively suppressed.

(Third and Fourth Aspects of the Invention)

[Measurement of Number-Average Molecular Weight]

Measured in the same manner as in the first aspect of the invention.

[Measurement of Extinction Coefficient]

The extinction coefficient of the base material and workpiece was determined by measuring the absorbance at wavelength 355 nm by using a spectrophotometer (U-3410 of Hitachi, Ltd.), and calculating from the value of absorbance.

Example 1

The workpiece was a polystyrene sheet (thickness: 100 μm, extinction coefficient; 48 cm$^{-1}$). On a base material made of polyurethane (thickness: 20 μm, extinction coefficient: 125 cm$^{-1}$), ultraviolet curable acrylic adhesive solution (1) was applied, and dried to form an adhesive layer (thickness 10 μm), and a protective sheet was obtained. The extinction coefficient ratio was 2.6.

The acrylic adhesive solution (1) was prepared as follows. In 100 parts by weight of acrylic polymer of number-average molecular weight of 800,000 obtained by copolymerization of butyl acrylate, ethyl acrylate, 2-hydroxy ethyl acrylate, and acrylic acid at ratio by weight of 60/40/4/1, 90 parts by weight of dipenta erythritol monohydroxy penta acrylate as photopolymerizable compound, 5 parts by weight of benzyl dimethyl ketal (Irgacure 651) as photopolymerization initiator, and 2 parts by weight of polyisocyanate compound (Coronate L of NIPPON POLYURETHANE INDUSTRY CO., LTD.) were added together with 650 parts by weight of toluene, and the mixture was uniformly dissolved and stirred, and the acrylic adhesive solution (1) was prepared.

On one side of the polystyrene sheet, the manufactured protective sheet was adhered by a roll laminator, and a polystyrene sheet with protective sheet was fabricated.

On an XY stage mounting an adsorption plate of glass epoxy resin, the polystyrene sheet with protective sheet was placed with the protective sheet upside. Using YAG laser of wavelength 355 nm, average output 5 W and repetition frequency 30 kHz, third harmonic wave (355 nm) was focused on the surface of polystyrene sheet with protective sheet in a diameter of 25 μm by fθ lens, and the surface was scanned by laser beam at a speed of 20 mm/sec by galvano scanner, and was cut off. At this time, cutting of protective sheet and polystyrene sheet was confirmed. The protective sheet was irradiated with ultraviolet ray, and the adhesive layer was cured. After peeling off the protective sheet, the protective sheet gluing surface of the polystyrene sheet (the laser beam incident side) was observed particularly in the laser processing area, and decomposition products (deposits) were not observed.

Comparative Example 1

The polystyrene sheet was processed by laser in the same manner as in Example 1, except that protective sheet was not glued to one side of the polystyrene sheet. When the processing area of the laser beam incident side of the polystyrene sheet was observed, sticking of much residue of scattering decomposition products was recognized.

Comparative Example 2

The polystyrene sheet was processed by laser in the same manner as in Example 1, except that ethylene-vinyl acetate copolymer sheet (thickness: 100 μm, extinction coefficient: 19 cm$^{-1}$) was used as base material of protective sheet. The extinction coefficient ratio was 0.4. As a result, the protective sheet was not cut off, and the polystyrene sheet in the lower layer was processed by laser, and foams including decomposition product residue were generated between the protective sheet and polystyrene sheet. The protective sheet was irradiated with ultraviolet rays, and the adhesive layer was cured. By peeling off the protective sheet, the opening area of the laser beam incident side of the polystyrene sheet was observed, and sticking of much residue of decomposition products of silicon wafer was recognized.

Example 2

The workpiece was a silicon wafer (thickness: 100 μm). The silicon wafer with protective sheet was manufactured in the same manner as in Example 1, except that a silicone rubber sheet (thickness: 25 μm, extinction coefficient: 20.7 cm$^{-1}$) was used as base material of protective sheet.

Further, on a base material (thickness: 100 μm) of polyethylene, the acrylic adhesive solution (1) was applied, and dried to form an adhesive layer (thickness: 10 μm), and an adhesive sheet was manufactured. The adhesive sheet was glued to the back side of the silicon wafer with protective sheet, and the silicon wafer with protective and adhesive sheets was manufactured. By cutting in the same manner as in Example 1, the protective sheet and silicon wafer were cut off, but the adhesive sheet was not cut off. The protective sheet was irradiated with ultraviolet ray, and the adhesive layer was cured. After peeling off the protective sheet, the protective sheet gluing surface of the silicon wafer (the laser beam incident side) was observed particularly in the laser processing area, and decomposition products (deposits) were not observed.

Example 3

A silicon wafer with protective and adhesive sheets was manufactured in the same manner as in Example 2, except that a polyethylene terephthalate sheet (thickness: 25 μm, extinction coefficient: 80 cm$^{-1}$) was used as base material of protective sheet. By cutting in the same manner as in Example 1, the protective sheet and silicon wafer were cut off, but the adhesive sheet was not cut off. The protective sheet was irradiated with ultraviolet ray, and the adhesive layer was cured. After peeling off the protective sheet, the protective sheet gluing surface of the silicon wafer (the laser beam incident side) was observed particularly in the laser processing area, and decomposition products (deposits) were not observed.

Comparative Example 3

A silicon wafer with protective and adhesive sheets was manufactured in the same manner as in Example 2, except that ethylene-vinyl acetate copolymer sheet (thickness: 100 μm, extinction coefficient: 19 cm$^{-1}$) was used as base material of protective sheet.

By cutting in the same manner as in Example 1, the protective sheet was not cut off, but the silicon wafer in the lower layer was processed by laser, and foams including decomposition product residue were generated between the protective sheet and silicon wafer. The protective sheet was irradiated with ultraviolet rays, and the adhesive layer was cured. By peeling off the protective sheet, the opening area of the laser beam incident side of the silicon wafer was observed, and sticking of much residue of decomposition products of silicon wafer was recognized.

As known from these examples and comparisons, by using the protective sheet of which extinction coefficient ratio is 1 or more, contamination of surface of workpiece by decomposition products can be effectively suppressed. Further, when processing a metal material, by using the protective sheet having a base material of which extinction coefficient is 20 cm$^{-1}$ or more, contamination of surface of metal material by decomposition products can be effectively suppressed. As a result, the decomposition product removing process can be substantially simplified, and it contributes not only to reduction of environmental impact but also to enhancement of productivity.

(Fifth and Sixth Aspects of the Invention)

[Measurement of Number-Average Molecular Weight]

Measured in the same manner as in the first aspect of the invention.

[Measurement of Density]

The density of the base material of protective sheet and workpiece was measured by using pycnometer and water.

Example 1

The workpiece was a polycarbonate sheet (thickness: 100 μm, density: 1.20 g/cm$^3$). On a base material made of polyethylene naphthalate (thickness: 20 μm, density: 1.36 g/cm$^3$), so that the density ratio may be 1 or more, ultraviolet curable acrylic adhesive solution (1) was applied, and dried to form an adhesive layer (thickness: 10 μm), and a protective sheet was obtained. The density ratio was 1.13.

The acrylic adhesive solution (1) was prepared as follows. In 100 parts by weight of acrylic polymer of number-average molecular weight of 700,000 obtained by copolymerization of butyl acrylate, ethyl acrylate, 2-hydroxy ethyl acrylate, and acrylic acid at ratio by weight of 65/35/4/1, 90 parts by weight of dipenta erythritol monohydroxy penta acrylate as photopolymerizable compound, 5 parts by weight of benzyl dimethyl ketal (Irgacure 651) as photopolymerization initiator, and 2 parts by weight of polyisocyanate compound (Coronate L of NIPPON POLYURETHANE INDUSTRY CO., LTD.) were added together with 650 parts by weight of toluene, and the mixture was uniformly dissolved and stirred, and the acrylic adhesive solution (1) was prepared.

On one side of the polycarbonate sheet, the manufactured protective sheet was adhered by a roll laminator, and a polycarbonate sheet with protective sheet was fabricated.

On an XY stage mounting an adsorption plate of glass epoxy resin, the polycarbonate sheet with protective sheet was placed with the protective sheet upside. Using YAG laser of wavelength 355 nm, average output 5 W and repetition frequency 30 kHz, third harmonic wave (355 nm) was focused on the surface of polycarbonate sheet with protective sheet in a diameter of 25 μm by fθ lens, and the surface was scanned by laser beam at a speed of 20 mm/sec by galvano scanner, and was cut off. At this time, cutting of protective sheet and polycarbonate sheet was confirmed. The protective sheet was irradiated with ultraviolet ray, and the adhesive layer was cured. After peeling off the protective sheet, the protective sheet gluing surface of the polycarbonate sheet (the laser beam incident side) was observed particularly in the laser processing area, and decomposition products (deposits) were not observed.

Comparative Example 1

The polycarbonate sheet was processed by laser in the same manner as in Example 1, except that protective sheet was not glued to one side of the polycarbonate sheet. When the processing area of the laser beam incident side of the polycarbonate sheet was observed, sticking of much residue of scattering decomposition products was recognized.

Comparative Example 2

The polycarbonate sheet was processed by laser in the same manner as in Example 1, except that polynorbornene sheet (thickness: 100 μm, density: 1.00 g/cm$^3$) was used as base material of protective sheet. The density ratio was 0.83.

As a result, the protective sheet was not cut off, and the polycarbonate sheet in the lower layer was processed by laser, and foams including decomposition product residue were generated between the protective sheet and polycarbonate sheet. The protective sheet was irradiated with ultraviolet rays, and the adhesive layer was cured. By peeling off the protective sheet, the opening area of the laser beam incident side of the polystyrene sheet was observed, and sticking of much residue of decomposition products of silicon wafer was recognized.

Example 2

The workpiece was a polystyrene sheet (thickness: 100 μm, density: 1.04 g/cm$^3$). The polystyrene sheet with protective sheet was manufactured in the same manner as in Example 1, except that a polyimide sheet (thickness: 20 μm, density: 1.5 g/cm$^3$) was used as base material of protective sheet. The density ratio was 1.44. Further, on a base material (thickness: 75 μm) of vinyl alcohol, the acrylic adhesive solution (1) was applied, and dried to form an adhesive layer (thickness: 10 μm), and an adhesive sheet was manufactured. The adhesive sheet was glued to the back side of the polystyrene sheet with protective sheet, and the polystyrene sheet with protective and adhesive sheets was manufactured. By cutting in the same manner as in Example 1, the protective sheet and polystyrene sheet were cut off, but the adhesive sheet was not cut off. The protective sheet was irradiated with ultraviolet ray, and the adhesive layer was cured. After peeling off the protective sheet, the protective sheet gluing surface of the polystyrene sheet (the laser beam incident side) was observed particularly in the laser processing area, and decomposition products (deposits) were not observed.

Example 3

A silicon wafer with protective and adhesive sheets was manufactured in the same manner as in Example 2, except that a silicon wafer (thickness: 100 μm) was used instead of polystyrene sheet. By cutting in the same manner as in Example 1, the protective sheet and silicon wafer were cut off, but the adhesive sheet was not cut off. The protective sheet was irradiated with ultraviolet ray, and the adhesive layer was cured. After peeling off the protective sheet, the protective sheet gluing surface of the silicon wafer (the laser beam incident side) was observed particularly in the laser processing area, and decomposition products (deposits) were not observed.

Comparative Example 3

A silicon wafer with protective and adhesive sheets was manufactured in the same manner as in Example 3, except that polynorbornene sheet (thickness: 100 μm, density: 1.00 g/cm$^3$) was used as base material of protective sheet.

By cutting in the same manner as in Example 1, the protective sheet was not cut off, but the silicon wafer in the lower layer was processed by laser, and foams including decomposition product residue were generated between the protective sheet and silicon wafer. The protective sheet was irradiated with ultraviolet rays, and the adhesive layer was cured. By peeling off the protective sheet, the opening area of the laser beam incident side of the silicon wafer was observed, and sticking of much residue of decomposition products of silicon wafer was recognized.

As known from these examples and comparisons, by using the protective sheet of which density ratio is 1 or more, or by using the protective sheet having a base material of which density is 1.1 g/cm$^3$ or more, contamination of surface of workpiece by decomposition products can be effectively suppressed. Further, the decomposition product removing process can be substantially simplified, and it contributes not only to reduction of environmental impact but also to enhancement of productivity.

(Seventh and Eighth Aspects of the Invention)

[Measurement of Number-Average Molecular Weight]

Measured in the same manner as in the first aspect of the invention.

[Measurement of Tensile Strength]

The tensile strength of protective film and workpiece was measured by using tensiron (Shimadzu Autograph AGS50-D). The measuring condition is as follows.

Pulling speed: 20 mm/min
Chuck interval: 100 mm
Sample width: 10 mm

Example 1

The workpiece was a polystyrene sheet (thickness: 100 μm, tensile strength: 44 MPa). On a base material made of polyethylene naphthalate (thickness: 50 μm), ultraviolet curable acrylic adhesive solution (1) was applied, and dried to form an adhesive layer (thickness: 10 μm), and a protective sheet (tensile strength: 282 MPa) was obtained. The tensile strength ratio was 6.4.

The acrylic adhesive solution (1) was prepared as follows. In 100 parts by weight of acrylic polymer of number-average molecular weight of 700,000 obtained by copolymerization of butyl acrylate, ethyl acrylate, 2-hydroxy ethyl acrylate, and acrylic acid at ratio by weight of 65/35/4/1, 90 parts by weight of dipenta erythritol monohydroxy penta acrylate as photopolymerizable compound, 5 parts by weight of benzyl dimethyl ketal (Irgacure 651) as photopolymerization initiator, and 2 parts by weight of polyisocyanate compound (Coronate L of NIPPON POLYURETHANE INDUSTRY CO., LTD.) were added together with 650 parts by weight of toluene, and the mixture was uniformly dissolved and stirred, and the acrylic adhesive solution (1) was prepared.

On one side of the polystyrene sheet, the manufactured protective sheet was adhered by a roll laminator, and a polystyrene sheet with protective sheet was fabricated.

On an XY stage mounting an adsorption plate of glass epoxy resin, the polystyrene sheet with protective sheet was placed with the protective sheet upside. Using YAG laser of wavelength 355 nm, average output 5 W and repetition frequency 30 kHz, third harmonic wave (355 nm) was focused on the surface of polystyrene sheet with protective sheet in a diameter of 25 μm by fθ lens, and the surface was scanned by laser beam at a speed of 20 mm/sec by galvano scanner, and was cut off. At this time, cutting of protective sheet and polystyrene sheet was confirmed. The protective sheet was irradiated with ultraviolet ray, and the adhesive layer was cured. After peeling off the protective sheet, the protective sheet gluing surface of the polystyrene sheet (the laser beam incident side) was observed particularly in the laser processing area, and decomposition products (deposits) were not observed.

Comparative Example 1

The polystyrene sheet was processed by laser in the same manner as in Example 1, except that protective sheet was not glued to one side of the polystyrene sheet. When the processing area of the laser beam incident side of the polystyrene sheet was observed, sticking of much residue of scattering decomposition products was recognized.

Comparative Example 2

The polystyrene sheet was processed by laser in the same manner as in Example 1, except that ethylene-vinyl acetate copolymer sheet (thickness: 100 μm) was used as base material of protective sheet. The tensile strength of the protective sheet was 17 MPa and the tensile strength ratio was 0.4. As a result, the protective sheet was not cut off, and the polystyrene sheet in the lower layer was processed by laser, and foams including decomposition product residue were generated between the protective sheet and polystyrene sheet. The protective sheet was irradiated with ultraviolet rays, and the adhesive layer was cured. By peeling off the protective sheet, the opening area of the laser beam incident side of the polystyrene sheet was observed, and sticking of much residue of decomposition products of polystyrene was recognized.

Example 2

The workpiece was a silicon wafer (thickness: 100 μm). The silicon wafer with protective sheet was manufactured in the same manner as in Example 1, except that a polyimide sheet (thickness: 25 μm) was used as base material of protective sheet. The tensile strength of the protective film was 340 MPa.

Further, on a base material (thickness: 100 μm) of polyethylene, the acrylic adhesive solution (1) was applied, and dried to form an adhesive layer (thickness: 10 μm), and an adhesive sheet was manufactured. The adhesive sheet was glued to the back side of the silicon wafer with protective sheet, and the silicon wafer with protective and adhesive sheets was manufactured. By cutting in the same manner as in Example 1, the protective sheet and silicon wafer were cut off, but the adhesive sheet was not cut off. The protective sheet was irradiated with ultraviolet ray, and the adhesive layer was cured. After peeling off the protective sheet, the protective sheet gluing surface of the silicon wafer (the laser beam incident side) was observed particularly in the laser processing area, and decomposition products (deposits) were not observed.

Example 3

A silicon wafer with protective and adhesive sheets was manufactured in the same manner as in Example 2, except that a polyethylene terephthalate sheet (thickness: 25 µm) was used as base material of protective sheet. The tensile strength of the protective sheet was 140 MPa. By cutting in the same manner as in Example 1, the protective sheet and silicon wafer were cut off, but the adhesive sheet was not cut off. The protective sheet was irradiated with ultraviolet ray, and the adhesive layer was cured. After peeling off the protective sheet, the protective sheet gluing surface of the silicon wafer (the laser beam incident side) was observed particularly in the laser processing area, and decomposition products (deposits) were not observed.

Comparative Example 3

A silicon wafer with protective and adhesive sheets was manufactured in the same manner as in Example 2, except that ethylene-vinyl acetate copolymer sheet (thickness: 100 µm) was used as base material of protective sheet. The tensile strength of the protective sheet was 17 MPa. By cutting in the same manner as in Example 1, the protective sheet was not cut off, but the silicon wafer in the lower layer was processed by laser, and foams including decomposition product residue were generated between the protective sheet and silicon wafer. The protective sheet was irradiated with ultraviolet rays, and the adhesive layer was cured. By peeling off the protective sheet, the opening area of the laser beam incident side of the silicon wafer was observed, and sticking of much residue of decomposition products of silicon wafer was recognized.

As known from these examples and comparisons, by selecting and using the protective sheet of which tensile strength ratio is 1 or more (the protective sheet of which tensile strength is 100 MPa or more), contamination of surface of workpiece (or metal material) by decomposition products can be effectively suppressed. Further, the decomposition product removing process can be substantially simplified, and it contributes not only to reduction of environmental impact but also to enhancement of productivity.

(Ninth Aspect of the Invention)

[Measurement of Number-Average Molecular Weight]

Measured in the same manner as in the first aspect of the invention.

[Measurement of Specific Heat]

The specific heat of base material of protective sheet and workpiece was measured by using a heat analysis system (DSC EXSTAR 6000 of Seiko Instruments Inc.). Measuring at temperature rise speed of 10° C./min, three DSC curves of empty container, sample, and reference (water) were determined. The specific heat was calculated in the following formula.

$$Cps = (Ys/Yr) \times (Mr/Ms) \times Cpr$$

where
  Cps: specific heat of sample
  Cpr: specific heat of reference (water: 4.2 J/(g·K))
  Ys: DSC curve difference of sample and empty container
  Yr: DSC curve difference of reference and empty container
  Ms: mass of sample
  Mr: mass of reference Example 1

The workpiece was a polyimide sheet (thickness: 100 µm, specific heat: 1.1 J/(g·K)). On a base material made of polyethylene naphthalate (thickness: 50 µm, specific heat: 0.75 J/(g·K)), ultraviolet curable acrylic adhesive solution (1) was applied, and dried to form an adhesive layer (thickness 10 µm), and a protective sheet was obtained in order that the specific heat ratio may be less than 1. The specific heat ratio was 0.68.

The acrylic adhesive solution (1) was prepared as follows. In 100 parts by weight of acrylic polymer of number-average molecular weight of 700,000 obtained by copolymerization of butyl acrylate, ethyl acrylate, 2-hydroxy ethyl acrylate, and acrylic acid at ratio by weight of 65/35/4/1, 90 parts by weight of dipenta erythritol monohydroxy penta acrylate as photopolymerizable compound, 5 parts by weight of benzyl dimethyl ketal (Irgacure 651) as photopolymerization initiator, and 2 parts by weight of polyisocyanate compound (Coronate L of NIPPON POLYURETHANE INDUSTRY CO., LTD.) were added together with 650 parts by weight of toluene, and the mixture was uniformly dissolved and stirred, and the acrylic adhesive solution (1) was prepared.

On one side of the polyimide sheet, the manufactured protective sheet was adhered by a roll laminator, and a polyimide sheet with protective sheet was fabricated.

On an XY stage mounting an adsorption plate of glass epoxy resin, the polyimide sheet with protective sheet was placed with the protective sheet upside. Using YAG laser of wavelength 355 nm, average output 5 W and repetition frequency 30 kHz, third harmonic wave (355 nm) was focused on the surface of polyimide sheet with protective sheet in a diameter of 25 µm by fθ lens, and the surface was scanned by laser beam at a speed of 20 mm/sec by galvano scanner, and was cut off. At this time, cutting of protective sheet and polyimide sheet was confirmed. The protective sheet was irradiated with ultraviolet ray, and the adhesive layer was cured. After peeling off the protective sheet, the protective sheet gluing surface of the polyimide sheet (the laser beam incident side) was observed particularly in the laser processing area, and decomposition products (deposits) were not observed.

Comparative Example 1

The polyimide sheet was processed by laser in the same manner as in Example 1, except that protective sheet was not glued to one side of the polyimide sheet. When the processing area of the laser beam incident side of the polyimide sheet was observed, sticking of much residue of scattering decomposition products was recognized.

Comparative Example 2

The polyimide sheet was processed by laser in the same manner as in Example 1, except that ethylene-vinyl acetate copolymer sheet (thickness: 100 µm, specific heat: 2.2 J/(g·K)) was used as base material of protective sheet. The specific heat ratio was 2.0.

As a result, the protective sheet was not cut off, and the polyimide sheet in the lower layer was processed by laser, and foams including decomposition product residue were generated between the protective sheet and polyimide sheet. The protective sheet was irradiated with ultraviolet rays, and the adhesive layer was cured. By peeling off the protective sheet, the opening area of the laser beam incident side of the polyimide sheet was observed, and sticking of much residue of decomposition products of polyimide was recognized.

Example 2

The workpiece was a silicon wafer (thickness: 100 μm, specific heat: 0.77 J/(g·K)), and the silicon wafer with protective sheet was manufactured in the same manner as in Example 1. The specific heat ratio was 0.97.

Further, on a base material (thickness: 100 μm) of polyethylene, the acrylic adhesive solution (1) was applied, and dried to form an adhesive layer (thickness: 10 μm), and an adhesive sheet was manufactured. The adhesive sheet was glued to the back side of the silicon wafer with protective sheet, and the silicon wafer with protective and adhesive sheets was manufactured. By cutting in the same manner as in Example 1, the protective sheet and silicon wafer were cut off, but the adhesive sheet was not cut off. The protective sheet was irradiated with ultraviolet ray, and the adhesive layer was cured. After peeling off the protective sheet, the protective sheet gluing surface of the silicon wafer (the laser beam incident side) was observed particularly in the laser processing area, and decomposition products (deposits) were not observed.

Example 3

A silicon wafer with protective and adhesive sheets was manufactured in the same manner as in Example 2, except that a polyurethane sheet (thickness: 25 μm, specific heat: 0.48 J/(g·K)) was used as base material of protective sheet in order that the specific heat ratio may be less than 1. The specific heat ratio was 0.62. By cutting in the same manner as in Example 1, the protective sheet and silicon wafer were cut off, but the adhesive sheet was not cut off. The protective sheet was irradiated with ultraviolet ray, and the adhesive layer was cured. After peeling off the protective sheet, the protective sheet gluing surface of the silicon wafer (the laser beam incident side) was observed particularly in the laser processing area, and decomposition products (deposits) were not observed.

As known from these examples and comparisons, by using the protective sheet of which specific heat ratio is less than 1, contamination of surface of workpiece by decomposition products can be effectively suppressed. Further, the decomposition product removing process can be substantially simplified, and it contributes not only to reduction of environmental impact but also to enhancement of productivity.

(Tenth and Eleventh Aspects of the Invention)

[Measurement of Number-Average Molecular Weight]

Measured in the same manner as in the first aspect of the invention.

[Measurement of Refractive Index]

The refractive index of base material and organic workpiece was measured by using Abbe refractometer (DR-M4 of ATAGO). The measuring wavelength is 546 nm.

Example 1

The workpiece was a polypropylene sheet (thickness: 60 μm, refractive index: 1.51). On a base material made of polystyrene (thickness: 20 μm, refractive index: 1.59), ultraviolet curable acrylic adhesive solution (1) was applied, and dried to form an adhesive layer (thickness 10 μm), and a protective sheet was obtained. The refractive index ratio was 1.05.

The acrylic adhesive solution (1) was prepared as follows. In 100 parts by weight of acrylic polymer of number-average molecular weight of 800,000 obtained by copolymerization of butyl acrylate, ethyl acrylate, 2-hydroxy ethyl acrylate, and acrylic acid at ratio by weight of 60/40/4/1, 90 parts by weight of dipenta erythritol monohydroxy penta acrylate as photopolymerizable compound, 5 parts by weight of benzyl dimethyl ketal (Irgacure 651) as photopolymerization initiator, and 2 parts by weight of polyisocyanate compound (Coronate L of NIPPON POLYURETHANE INDUSTRY CO., LTD.) were added together with 650 parts by weight of toluene, and the mixture was uniformly dissolved and stirred, and the acrylic adhesive solution (1) was prepared.

On one side of the polypropylene sheet, the manufactured protective sheet was adhered by a roll laminator, and a polypropylene sheet with protective sheet was fabricated.

On an XY stage mounting an adsorption plate of glass epoxy resin, the polypropylene sheet with protective sheet was placed with the protective sheet upside. Using YAG laser of wavelength 355 nm, average output 5 W and repetition frequency 30 kHz, third harmonic wave (355 nm) was focused on the surface of polypropylene sheet with protective sheet in a diameter of 25 μm by fθ lens, and the surface was scanned by laser beam at a speed of 20 mm/sec by galvano scanner, and was cut off. At this time, cutting of protective sheet and polypropylene sheet was confirmed. The protective sheet was irradiated with ultraviolet ray, and the adhesive layer was cured. After peeling off the protective sheet, the protective sheet gluing surface of the polypropylene sheet (the laser beam incident side) was observed particularly in the laser processing area, and decomposition products (deposits) were not observed.

Comparative Example 1

The polypropylene sheet was processed by laser in the same manner as in Example 1, except that protective sheet was not glued to one side of the polypropylene sheet. When the processing area of the laser beam incident side of the polypropylene sheet was observed, sticking of much residue of scattering decomposition products was recognized.

Comparative Example 2

The polypropylene sheet was processed by laser in the same manner as in Example 1, except that polymethyl pentene sheet (thickness: 100 μm, refractive index: 1.46) was used as base material of protective sheet. The refractive index ratio was 0.97. As a result, the protective sheet was not cut off, and the polypropylene sheet in the lower layer was processed by laser, and foams including decomposition product residue were generated between the protective sheet and polypropylene sheet. The protective sheet was irradiated with ultraviolet rays, and the adhesive layer was cured. By peeling off the protective sheet, the opening area of the laser beam incident side of the polypropylene sheet was observed, and sticking of much residue of decomposition products of polypropylene was recognized.

Example 2

The workpiece was a polycarbonate sheet (thickness: 100 μm, refractive index: 1.59). The polycarbonate sheet with protective sheet was manufactured in the same manner as in Example 1, except that a polyethylene terephthalate sheet (thickness: 20 μm, refractive index: 1.66) was used as base material of protective sheet. The refractive index ratio was 1.04.

Further, on a base material (thickness: 100 μm) of polyethylene, the acrylic adhesive solution (1) was applied, and dried to form an adhesive layer (thickness: 10 μm), and an adhesive sheet was manufactured. The adhesive sheet was glued to the back side of the polycarbonate sheet with protective sheet, and the polycarbonate sheet with protective and adhesive sheets was manufactured. By cutting in the same manner as in Example 1, the protective sheet and polycarbonate sheet were cut off, but the adhesive sheet was not cut off. The protective sheet was irradiated with ultraviolet ray, and the adhesive layer was cured. After peeling off the protective sheet, the protective sheet gluing surface of the polycarbonate sheet (the laser beam incident side) was observed particularly in the laser processing area, and decomposition products (deposits) were not observed.

Example 3

A silicon wafer with protective and adhesive sheets was manufactured in the same manner as in Example 2, except that a silicon wafer (thickness: 100 μm) was used instead of the polycarbonate sheet. By cutting in the same manner as in Example 1, the protective sheet and silicon wafer were cut off, but the adhesive sheet was not cut off. The protective sheet was irradiated with ultraviolet ray, and the adhesive layer was cured. After peeling off the protective sheet, the protective sheet gluing surface of the silicon wafer (the laser beam incident side) was observed particularly in the laser processing area, and decomposition products (deposits) were not observed.

Comparative Example 3

A silicon wafer with protective and adhesive sheets was manufactured in the same manner as in Example 3, except that polypropylene sheet (thickness: 60 μm, refractive index: 1.51) was used as base material of protective sheet. By cutting in the same manner as in Example 1, the protective sheet was not cut off, but the silicon wafer in the lower layer was processed by laser, and foams including decomposition product residue were generated between the protective sheet and silicon wafer. The protective sheet was irradiated with ultraviolet rays, and the adhesive layer was cured. By peeling off the protective sheet, the opening area of the laser beam incident side of the silicon wafer was observed, and sticking of much residue of decomposition products of silicon wafer was recognized.

As known from these examples and comparisons, by using the protective sheet of which refractive index ratio is 1 or more, or the protective sheet having a base material of which refractive index at wavelength 546 nm of 1.53 or more, contamination of surface of workpiece (or metal material) by decomposition products can be effectively suppressed. Further, the decomposition product removing process can be substantially simplified, and it contributes not only to reduction of environmental impact but also to enhancement of productivity.

(Twelfth and Thirteenth Aspects of the Invention)

[Measurement of Number-Average Molecular Weight]

Measured in the same manner as in the first aspect of the invention.

Example 1

The workpiece was a polycarbonate sheet (thickness: 100 μm, total coupling energy B: 720 kJ/mol).

On a base material made of polyethylene naphthalate (thickness: 50 μm, total coupling energy A: 692 kJ/mol), in order that the total coupling energy ratio may be less than 1, ultraviolet curable acrylic adhesive solution (1) was applied, and dried to form an adhesive layer (thickness 10 μm), and a protective sheet was obtained. The total coupling energy ratio was 0.96.

The acrylic adhesive solution (1) was prepared as follows. In 100 parts by weight of acrylic polymer of number-average molecular weight of 700,000 obtained by copolymerization of butyl acrylate, ethyl acrylate, 2-hydroxy ethyl acrylate, and acrylic acid at ratio by weight of 65/35/4/1, 90 parts by weight of dipenta erythritol monohydroxy penta acrylate as photopolymerizable compound, 5 parts by weight of benzyl dimethyl ketal (Irgacure 651) as photopolymerization initiator, and 2 parts by weight of polyisocyanate compound (Coronate L of NIPPON POLYURETHANE INDUSTRY CO., LTD.) were added together with 650 parts by weight of toluene, and the mixture was uniformly dissolved and stirred, and the acrylic adhesive solution (1) was prepared.

On one side of the polycarbonate sheet, the manufactured protective sheet was adhered by a roll laminator, and a polycarbonate sheet with protective sheet was fabricated.

On an XY stage mounting an adsorption plate of glass epoxy resin, the polycarbonate sheet with protective sheet was placed with the protective sheet upside. Using YAG laser of wavelength 355 nm, average output 5 W and repetition frequency 30 kHz, third harmonic wave (355 nm) was focused on the surface of polycarbonate sheet with protective sheet in a diameter of 25 μm by fθ lens, and the surface was scanned by laser beam at a speed of 20 mm/sec by galvano scanner, and was cut off. At this time, cutting of protective sheet and polycarbonate sheet was confirmed. The protective sheet was irradiated with ultraviolet ray, and the adhesive layer was cured. After peeling off the protective sheet, the protective sheet gluing surface of the polycarbonate sheet (the laser beam incident side) was observed particularly in the laser processing area, and decomposition products (deposits) were not observed.

Comparative Example 1

The polycarbonate sheet was processed by laser in the same manner as in Example 1, except that protective sheet was not glued to one side of the polycarbonate sheet. When the processing area of the laser beam incident side of the polycarbonate sheet was observed, sticking of much residue of scattering decomposition products was recognized.

Comparative Example 2

The polycarbonate sheet was processed by laser in the same manner as in Example 1, except that ethylene-vinyl acetate copolymer sheet (thickness: 100 μm, total coupling energy A: 962 kJ/mol) was used as base material of protective sheet. The total coupling energy ratio was 1.34. As a result, the protective sheet was not cut off, and the polycarbonate sheet in the lower layer was processed by laser, and foams including decomposition product residue were generated between the protective sheet and polycarbonate sheet. The protective sheet was irradiated with ultraviolet rays, and the adhesive layer was cured. By peeling off the protective sheet, the opening area of the laser beam incident side of the polycarbonate sheet was observed, and sticking of much residue of decomposition products of polycarbonate was recognized.

Example 2

The silicon wafer with protective sheet was manufactured in the same manner as in Example 1, except the workpiece was a silicon wafer (thickness: 100 µm).

Further, on a base material (thickness: 100 µm) of polyethylene, the acrylic adhesive solution (1) was applied, and dried to form an adhesive layer (thickness: 10 µm), and an adhesive sheet was manufactured. The adhesive sheet was glued to the back side of the silicon wafer with protective sheet, and the silicon wafer with protective and adhesive sheets was manufactured.

By cutting in the same manner as in Example 1, the protective sheet and silicon wafer were cut off, but the adhesive sheet was not cut off. The protective sheet was irradiated with ultraviolet ray, and the adhesive layer was cured. After peeling off the protective sheet, the protective sheet gluing surface of the silicon wafer (the laser beam incident side) was observed particularly in the laser processing area, and decomposition products (deposits) were not observed.

Example 3

A silicon wafer with protective and adhesive sheets was manufactured in the same manner as in Example 2, except that a polyethylene terephthalate sheet (thickness: 25 µm, total coupling energy A: 692 kJ/mol) was used as base material of protective sheet.

By cutting in the same manner as in Example 1, the protective sheet and silicon wafer were cut off, but the adhesive sheet was not cut off. The protective sheet was irradiated with ultraviolet ray, and the adhesive layer was cured. After peeling off the protective sheet, the protective sheet gluing surface of the silicon wafer (the laser beam incident side) was observed particularly in the laser processing area, and decomposition products (deposits) were not observed.

Comparative Example 3

A silicon wafer with protective and adhesive sheets was manufactured in the same manner as in Example 2, except that ethylene-vinyl acetate copolymer sheet (thickness: 100 µm, total coupling energy A: 962 kJ/mol) was used as base material of protective sheet.

By cutting in the same manner as in Example 1, the protective sheet was not cut off, but the silicon wafer in the lower layer was processed by laser, and foams including decomposition product residue were generated between the protective sheet and silicon wafer. The protective sheet was irradiated with ultraviolet rays, and the adhesive layer was cured. By peeling off the protective sheet, the opening area of the laser beam incident side of the silicon wafer was observed, and sticking of much residue of decomposition products of silicon wafer was recognized.

As known from these examples and comparisons, by selecting and using the protective sheet of which total coupling energy ratio is less than 1, or the protective sheet having a base material of which total coupling energy A is less than 800 kJ/mol, contamination of surface of workpiece by decomposition products can be effectively suppressed. Further, the decomposition product removing process can be substantially simplified, and it contributes not only to reduction of environmental impact but also to enhancement of productivity.

INDUSTRIAL APPLICABILITY

The protective sheet for laser processing of the invention is used when processing the workpiece by ultraviolet absorption ablation of laser beam. The invention also relates to the manufacturing method of laser processed parts obtained by processing of workpiece, such as cutting, drilling, marking, grooving, scribing, trimming and other processing, by ultraviolet absorption ablation of laser beam.

The invention claimed is:

1. A manufacturing method of laser processed parts by using a protective sheet for laser processing having at least an adhesive layer on a base material, with the density of the base material of 1.1 g/cm$^3$ or more, comprising a step of adhering an adhesive layer of the protective sheet for laser processing to the incident side of laser beam of a workpiece, a step of processing the protective sheet for laser processing and workpiece by irradiating with laser beam, and a step of peeling off the protective sheet for laser processing from the workpiece after processing,
    wherein said base material comprises a base polymer and a filler, said filler being selected from the group consisting of a colorant, a pigment, a dye, gold, copper, platinum, silver, fine metal particles, metal colloids, carbon particles, and inorganic particles,
    wherein said filler is 2-20 parts by weight per 100 parts of the base polymer, and
    wherein the workpiece is any one of sheet material, circuit board, semiconductor wafer, metal substrate, semiconductor laser light emitting or photo detecting element board, MEMS board, and semiconductor package.

2. A manufacturing method of laser processed parts by using a protective sheet for laser processing having at least an adhesive layer on a base material, with the density of the base material of 1.1 g/cm$^3$ or more, comprising a step of adhering an adhesive layer of the protective sheet for laser processing to the incident side of laser beam of metal material, a step of processing the protective sheet for laser processing and metal material by irradiating with laser beam, and a step of peeling off the protective sheet for laser processing from the metal material after processing,
    wherein said base material comprises a base polymer and a filler, said filler being selected from the group consisting of a colorant, a pigment, a dye, gold, copper, platinum, silver, fine metal particles, metal colloids, carbon particles, and inorganic particles, and
    wherein said filler is 2-20 parts by weight per 100 parts of the base polymer.

3. The manufacturing method of claim 2, wherein the ratio of extinction coefficient at ultraviolet region wavelength λ of the base material to extinction coefficient at ultraviolet region wavelength λ of metal material (extinction coefficient ratio=extinction coefficient at ultraviolet region wavelength λ of base material of protective sheet for laser processing/extinction coefficient at ultraviolet region wavelength λ of metal material) is 1 or more.

4. The manufacturing method of claim 2, wherein the extinction coefficient at ultraviolet region wavelength λ of the base material is 20 cm$^{-1}$ or more.

5. The manufacturing method of laser processed parts of claim 3 or 4, wherein the ultraviolet region wavelength λ is 355 nm.

6. The manufacturing method of claim 2, wherein the ratio of density of the base material to density of metal material (density ratio=density of base material of protective sheet for laser processing/density of metal material) is 1 or more.

7. The manufacturing method of claim 2, wherein the ratio of tensile strength of protective sheet for laser processing to tensile strength of metal material (tensile strength ratio=tensile strength of protective sheet for laser processing/tensile strength of metal material) is 1 or more.

8. The manufacturing method of claim 2, wherein the protective sheet has a tensile strength of 100 MPa or more.

9. The manufacturing method of claim 2, wherein the specific heat of the base material to specific heat of metal material (specific heat ratio=specific heat of base material of protective sheet for laser processing/specific heat of metal material) is less than 1.

10. The manufacturing method of laser process parts of claim 2, wherein the base material contains aromatic polymer or silicone rubber.

11. A manufacturing method of laser processed parts by using a protective sheet for laser processing having at least an adhesive layer on a base material, with the density of the base material of 1.1 g/cm$^3$ or more, comprising a step of adhering an adhesive layer of the protective sheet for laser processing to the incident side of laser beam of a workpiece, a step of processing the protective sheet for laser processing and workpiece by irradiating with laser beam, and a step of peeling off the protective sheet for laser processing from the workpiece after processing,
wherein said base material comprises a base polymer and a filler, said filler being selected from the group consisting of a colorant, a pigment, a dye, gold, copper, platinum, silver, fine metal particles, metal colloids, carbon particles, and inorganic particles,
wherein said filler is 2-20 parts by weight per 100 parts of the base polymer, and
wherein the workpiece is semiconductor wafer or metal substrate.

12. A manufacturing method of laser processed parts by using a protective sheet for laser processing having at least an adhesive layer on a base material, with 1 or more of ratio of refractive index at wavelength 546 nm of the base material to refractive index at wavelength 546 nm of organic workpiece (refractive index ratio=refractive index at wavelength 546 nm of base material of protective sheet for laser processing/refractive index at wavelength 546 nm of organic workpiece), comprising a step of adhering an adhesive layer of the protective sheet for laser processing to the incident side of laser beam of the organic workpiece, a step of processing the protective sheet for laser processing and organic workpiece by irradiating with laser beam, and a step of peeling off the protective sheet for laser processing from the organic workpiece after processing,
wherein said base material comprises a base polymer and a filler, said filler being selected from the group consisting of a colorant, a pigment, a dye, gold, copper, platinum, silver, fine metal particles, metal colloids, carbon particles, and inorganic particles, and
wherein said filler is 2-20 parts by weight per 100 parts of the base polymer.

13. A manufacturing method of laser processed parts by using a protective sheet for laser processing having at least an adhesive layer on a base material, with less than 1 of total coupling energy ratio (total coupling energy ratio=total coupling energy A equivalent to minimum value among sums of coupling energy of one carbon atom in resin component for composing a base material and other atom coupled with the carbon atom/total coupling energy B equivalent to minimum value among sums of coupling energy of one carbon atom in material component for composing an organic workpiece and other atom coupled with the carbon atom, comprising a step of adhering an adhesive layer of protective sheet for laser processing to the incident side of laser beam of the organic workpiece, a step of processing the protective sheet for laser processing and organic workpiece by irradiating with laser beam, and a step of peeling off the protective sheet for laser processing from the organic workpiece after processing,
wherein said base material comprises a base polymer and a filler, said filler being selected from the group consisting of a colorant, a pigment, a dye, gold, copper, platinum, silver, fine metal particles, metal colloids, carbon particles, and inorganic particles, and
wherein said filler is 2-20 parts by weight per 100 parts of the base polymer.

14. A manufacturing method of laser processed parts by using a protective sheet for laser processing having at least an adhesive layer on a base material, with refractive index at wavelength 546 nm of the base material of 1.53 or more, comprising a step of adhering an adhesive layer of the protective sheet for laser processing to the incident side of laser beam of inorganic workpiece, a step of processing the protective sheet for laser processing and inorganic workpiece by irradiating with laser beam, and a step of peeling off the protective sheet for laser processing from the inorganic workpiece after processing,
wherein said base material comprises a base polymer and a filler, said filler being selected from the group consisting of a colorant, a pigment, a dye, gold, copper, platinum, silver, fine metal particles, metal colloids, carbon particles, and inorganic particles, and
wherein said filler is 2-20 parts by weight per 100 parts of the base polymer.

15. A manufacturing method of laser processed parts by using a protective sheet for laser processing having at least an adhesive layer on a base material, with total coupling energy A equivalent to minimum value among sums of coupling energy of one carbon atom in resin component for composing a base material and other atom coupled with the carbon atom of less than 800 kJ/mol, comprising a step of adhering an adhesive layer of protective sheet for laser processing to the incident side of laser beam of inorganic workpiece, a step of processing the protective sheet for laser processing and inorganic workpiece by irradiating with laser beam, and a step of peeling off the protective sheet for laser processing from the inorganic workpiece after processing,
wherein said base material comprises a base polymer and a filler, said filler being selected from the group consisting of a colorant, a pigment, a dye, gold, copper, platinum, silver, fine metal particles, metal colloids, carbon particles, and inorganic particles, and
wherein said filler is 2-20 parts by weight per 100 parts of the base polymer.

16. The manufacturing method of laser processed parts of claim 14 or 15, wherein the inorganic workpiece is any one of circuit board, semiconductor wafer, glass substrate, ceramic substrate, metal substrate, semiconductor laser light emitting or photo detecting element board, MEMS board, and semiconductor package.

* * * * *

UNITED STATES PATENT AND TRADEMARK OFFICE
CERTIFICATE OF CORRECTION

| | | |
|---|---|---|
| PATENT NO. | : 7,586,060 B2 | Page 1 of 1 |
| APPLICATION NO. | : 10/584825 | |
| DATED | : September 8, 2009 | |
| INVENTOR(S) | : Masakatsu Urairi et al. | |

It is certified that error appears in the above-identified patent and that said Letters Patent is hereby corrected as shown below:

At Column 14, Line 4, please delete "λm" and insert --μm--, therefor.

At Column 17, Line 10, please delete "naphthal imide" and insert --naphthalimide--, therefor.

At Column 19, Line 17, please delete "melamione" and insert --melamine--, therefor.

At Column 20, Line 20, please delete "2-methl" and insert --2-methyl--, therefor.

At Column 20, Line 21, please delete "dichlorothoixanthone," and insert --dichlorothioxanthone,--, therefor.

At Column 20, Line 24, please delete "phosphoanate," and insert --phosphonate,--, therefor.

Signed and Sealed this

Twenty-second Day of June, 2010

David J. Kappos
*Director of the United States Patent and Trademark Office*